(12) United States Patent
Pareek et al.

(10) Patent No.: US 11,300,249 B2
(45) Date of Patent: Apr. 12, 2022

(54) MOBILE SUPPORT ASSEMBLY FOR HOLDING AND TRANSPORTING A CONTAINER

(71) Applicants: Mayank Pareek, Amherst, NY (US); Ashwini K Sinha, East Amherst, NY (US); Stanley M Smith, Clarence Center, NY (US); Ranko Bursac, Libertyville, IL (US); Amber L Boll, Elma, NY (US); Merry Riehm-Constantino, Buffalo, NY (US); Amy Beth Hangen, Clarence, NY (US); Fred A Marconi, Jr., Erieville, NY (US)

(72) Inventors: Mayank Pareek, Amherst, NY (US); Ashwini K Sinha, East Amherst, NY (US); Stanley M Smith, Clarence Center, NY (US); Ranko Bursac, Libertyville, IL (US); Amber L Boll, Elma, NY (US); Merry Riehm-Constantino, Buffalo, NY (US); Amy Beth Hangen, Clarence, NY (US); Fred A Marconi, Jr., Erieville, NY (US)

(73) Assignee: Praxair Technology, Inc., Danbury, CT (US)

( * ) Notice: Subject to any disclaimer, the term of this patent is extended or adjusted under 35 U.S.C. 154(b) by 150 days.

(21) Appl. No.: 16/213,142

(22) Filed: Dec. 7, 2018

(65) Prior Publication Data

US 2019/0186694 A1 Jun. 20, 2019

Related U.S. Application Data

(60) Provisional application No. 62/608,120, filed on Dec. 20, 2017.

(51) Int. Cl.
*B62B 3/10* (2006.01)
*F17C 7/04* (2006.01)
(Continued)

(52) U.S. Cl.
CPC ............... *F17C 7/04* (2013.01); *B62B 3/104* (2013.01); *B62B 5/0414* (2013.01);
(Continued)

(58) Field of Classification Search
CPC .......... F17C 7/04; F17C 1/00; C23C 16/4581; B62B 3/104; B62B 5/0414
See application file for complete search history.

(56) References Cited

U.S. PATENT DOCUMENTS 2,396,368 A * 3/1946 Gorrell .................. B62B 3/104
414/458
2,654,493 A * 10/1953 Kernkamp .............. B62B 1/264
414/448

(Continued)

FOREIGN PATENT DOCUMENTS

CN 107323506 * 11/2017
CN 107323506 A 11/2017
(Continued)

*Primary Examiner* — Jacob B Meyer
(74) *Attorney, Agent, or Firm* — Nilay S. Dalal

(57) ABSTRACT

A mobile storage apparatus for containers is provided. The apparatus provides a unique support assembly for holding a container. The assembly includes a latch mechanism that allows a clamp of cylinder to be moved from a closed position to an open position which creates clearance around a neck of cylinder to allow it to rotate without falling out of clamp. The other end of apparatus is structurally configured with a release plunger that can be retracted to allow rotation of cylinder along said other end. Rotatable wheels on a user side with a braking mechanism along a handle and a foot ledge allow improved maneuverability and stability.

16 Claims, 13 Drawing Sheets

(51) Int. Cl.
*C23C 16/458* (2006.01)
*B62B 5/04* (2006.01)
*F17C 13/08* (2006.01)
*F17C 1/00* (2006.01)

(52) U.S. Cl.
CPC .......... *C23C 16/4581* (2013.01); *F17C 13/08* (2013.01); *B62B 2202/022* (2013.01); *B62B 2203/44* (2013.01); *F17C 1/00* (2013.01); *F17C 2201/0109* (2013.01); *F17C 2201/035* (2013.01); *F17C 2201/056* (2013.01); *F17C 2201/058* (2013.01); *F17C 2205/0107* (2013.01); *F17C 2205/0161* (2013.01); *F17C 2223/0123* (2013.01); *F17C 2223/0153* (2013.01); *F17C 2223/036* (2013.01); *F17C 2260/00* (2013.01)

(56) References Cited

U.S. PATENT DOCUMENTS

| | | | | |
|---|---|---|---|---|
| 3,064,991 | A * | 11/1962 | Huthsing, Jr. | B62B 1/264 280/47.24 |
| 3,868,033 | A * | 2/1975 | Le Duff | B67D 3/0029 414/648 |
| 4,738,582 | A * | 4/1988 | Roberts | B62B 3/04 248/142 |
| 4,797,050 | A * | 1/1989 | Habicht | B66F 9/19 414/420 |
| 5,145,311 | A * | 9/1992 | Salvucci | B62B 3/104 187/244 |
| 5,393,080 | A * | 2/1995 | Ross | B62B 1/264 280/47.26 |
| 5,658,118 | A * | 8/1997 | Luca | B62B 5/06 414/444 |
| 5,730,891 | A * | 3/1998 | Karpoff | B23K 9/32 219/136 |
| 6,799,769 | B2 * | 10/2004 | Ziolkowski | B62B 1/264 280/47.27 |
| 6,953,200 | B2 * | 10/2005 | Hartsock | B62B 3/04 280/79.5 |
| 7,789,611 | B2 * | 9/2010 | Wilson | B62B 3/04 414/421 |
| 7,824,144 | B2 * | 11/2010 | Wilson | B62B 5/0003 414/421 |
| 8,262,108 | B2 * | 9/2012 | Al-Hasan | B62B 3/04 280/47.371 |
| 8,967,634 | B2 * | 3/2015 | Barnes | B62B 3/04 280/47.29 |
| 9,388,029 | B2 * | 7/2016 | Ziaylek | B66F 9/18 |
| 9,390,952 | B2 * | 7/2016 | Lin | B62B 3/104 |
| 9,446,777 | B2 * | 9/2016 | Umbro | B62B 5/049 |
| 9,623,892 | B2 * | 4/2017 | Roach | B62B 3/04 |
| 9,630,640 | B1 * | 4/2017 | Collins | B62B 3/02 |
| 10,173,704 | B2 * | 1/2019 | Jones | B62B 1/264 |
| 2004/0104550 | A1 | 6/2004 | Do | |
| 2004/0183268 | A1 * | 9/2004 | Hartsock | B62B 3/04 280/79.5 |
| 2005/0194218 | A1 * | 9/2005 | D'Arca | B62B 5/0461 188/19 |
| 2006/0163829 | A1 | 7/2006 | Livengood et al. | |
| 2007/0292247 | A1 * | 12/2007 | Wilson | B66F 9/24 414/331.06 |
| 2008/0164669 | A1 | 7/2008 | Stone | |
| 2009/0285659 | A1 * | 11/2009 | Wilson | B62B 3/104 414/444 |
| 2010/0021275 | A1 * | 1/2010 | Ratermann | B62B 1/14 414/454 |
| 2010/0124476 | A1 * | 5/2010 | Berlinger | B62B 3/04 414/457 |
| 2011/0309076 | A1 | 12/2011 | Liebenberg et al. | |
| 2011/0318149 | A1 * | 12/2011 | Barnes | B62B 3/04 414/469 |
| 2012/0289765 | A1 | 11/2012 | Kaushansky et al. | |
| 2014/0265190 | A1 * | 9/2014 | Beaver | B62B 3/104 280/47.19 |
| 2014/0319438 | A1 * | 10/2014 | Carlson | B62B 3/02 254/2 R |
| 2015/0021448 | A1 * | 1/2015 | Cothern | B62B 3/104 248/123.2 |
| 2015/0151772 | A1 * | 6/2015 | Lin | B62B 3/04 414/509 |
| 2015/0167898 | A1 | 6/2015 | Hilton | |
| 2015/0203137 | A1 * | 7/2015 | Lang | B62B 3/104 414/469 |
| 2016/0031262 | A1 * | 2/2016 | Tabata | B66C 1/22 414/426 |
| 2016/0031467 | A1 * | 2/2016 | Beaver | B62B 3/02 280/659 |
| 2017/0050657 | A1 * | 2/2017 | Roach | B62B 3/04 |
| 2017/0101119 | A1 * | 4/2017 | Collins | B62B 3/104 |
| 2018/0072335 | A1 * | 3/2018 | Goodwin | B62B 3/104 |
| 2018/0327012 | A1 * | 11/2018 | Giboyau | B62B 3/04 |
| 2018/0340813 | A1 * | 11/2018 | Cowles | F17C 13/023 |
| 2019/0092210 | A1 * | 3/2019 | Marcusen | B62B 5/0089 |
| 2019/0186694 | A1 * | 6/2019 | Pareek | B62B 3/104 |
| 2020/0156526 | A1 * | 5/2020 | Marcusen | B62B 3/104 |

FOREIGN PATENT DOCUMENTS

| | | | |
|---|---|---|---|
| CN | 107351895 | A | 11/2017 |
| CN | 107416000 | * | 12/2017 |
| CN | 107139999 | * | 9/2018 |
| CN | 109131504 | A * | 1/2019 |
| DE | 202015102466 | U1 | 8/2016 |
| KR | 2018065005 | * | 6/2018 |
| KR | 2018079572 | * | 7/2018 |

* cited by examiner

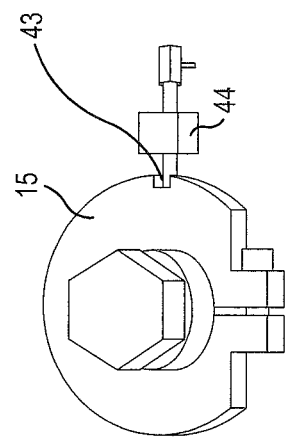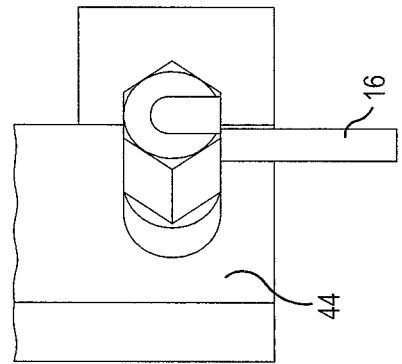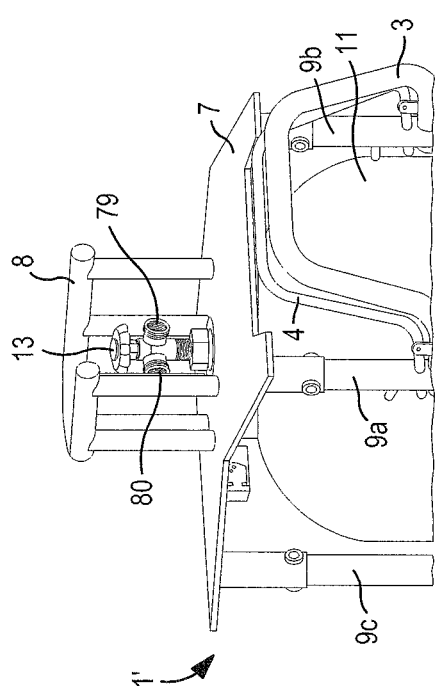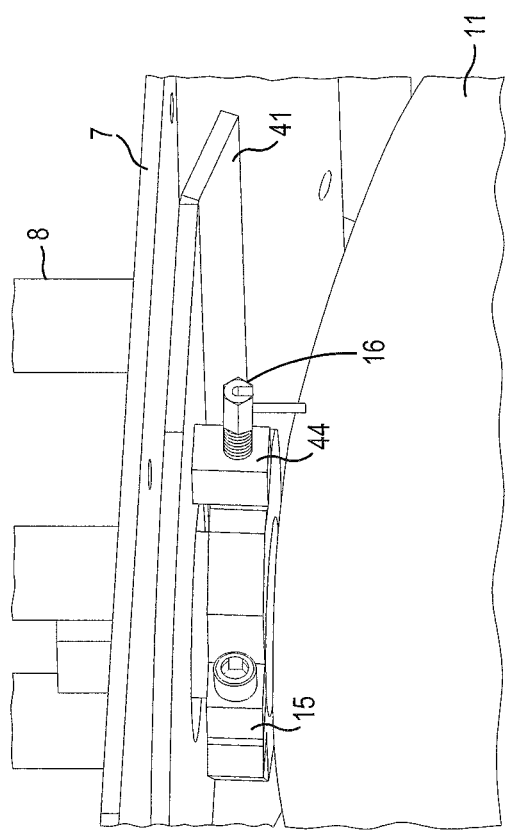

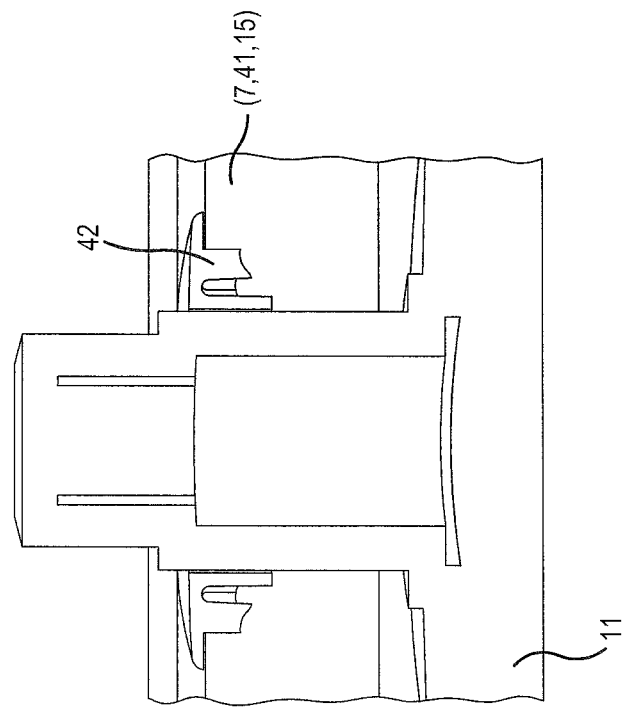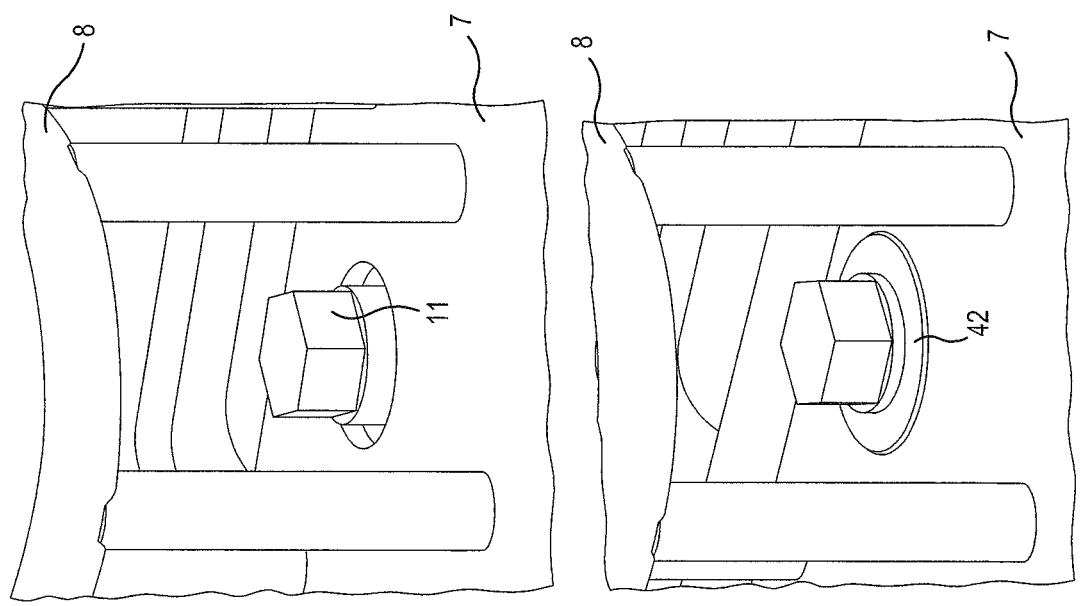

"1st OPEN POSITION"

"CLOSED POSITION"

"2nd open position"

"Deactivated state"

"Activate state"

MOBILE SUPPORT ASSEMBLY FOR HOLDING AND TRANSPORTING A CONTAINER

CROSS REFERENCE TO RELATED APPLICATION

This application claims the benefit of provisional application Ser. No. 62/608,120, filed Dec. 20, 2017, entitled MOBILE SUPPORT ASSEMBLY FOR HOLDING AND TRANSPORTING A CONTAINER.

FIELD OF THE INVENTION

The present invention relates to improved support assemblies for holding a container capable of transporting and maneuvering the container with stability.

BACKGROUND OF THE INVENTION

Typically, compressed gases are delivered as a pressurized vessel to a customer site. Such pressurized vessels are fitted with a dispensing valve and are commonly referred to as "gas cylinders". The movement of gas cylinders throughout various regions of onsite premises is often required by an end-user. However, transporting and maneuvering such gas cylinders from one point to another can be a difficult task, especially when the distances to be travelled are along narrow and/or constricted pathways, some of which may have uneven or elevated surfaces. The operational challenge can be exacerbated when the gas cylinders to be maneuvered increase in weight (e.g., up to about 150 kg), as the increase in weight can increase the tendency for the gas cylinders to fall while moving the cylinder. Handling of the gas cylinders becomes problematic, and the risk of safety hazards can potentially increase.

One known solution to remedy such operational challenges involves loading the gas cylinders onto a cart with wheels. However, such a solution still has numerous drawbacks. For example, the loading and unloading of the gas cylinders from the cart, even if only for relatively small distances within an on-site premise, still poses operational challenges and safety hazards. The problem is further compounded when the usage rate of these gas cylinders are increased, thereby requiring the end-user to accommodate the handling of a larger quantity of gas cylinders, and/or increase the storage capacity of the gas cylinders to avoid a substantial increase in the numbers of cylinders to be handled.

There is currently no viable mobile apparatus to store and transport pressurized vessels in a way that mitigates the foregoing operational challenges and safety hazards. There remains an unmet need for an improved mobile storage and transport apparatus that allows maneuverability of gas cylinders in a safe and user-friendly manner. Other aspects of the present invention will become apparent to one of ordinary skill in the art upon review of the specification, drawings and claims appended hereto.

SUMMARY OF THE INVENTION

The invention may include any of the following aspects in various combinations and may also include any other aspect described below in the written description or in the attached drawings.

The invention relates, in part, to a transportable support assembly discovered to provide improved maneuverability, safety and protection of containers mounted and secured to the transportable support assembly.

In a first aspect, a transportable support assembly (1') configured to securely hold a container (11) therewithin, said transportable support assembly (1'), comprising: a first clamp (15) spaced apart from a first plate (7); a second plate (14) located a predetermined distance away from the first clamp (15); multiple elongated rods (9a, 9b, 9c and 9d) extending between the first plate (7) and the second plate (14) and defining a first side (35) of the transportable support assembly (1') and a second side (36) of the transportable support assembly (1'), said second side (36) substantially diametrically opposed to the first side (35); the first plate (7), the second plate (14) and the multiple elongated rods (9a, 9b, 9c and 9d) being arranged to create a protective opening (29), said protective opening (29) adapted to receive the container (11) that can be secured to a second clamp (28) located on the second plate (14); and a protective ring (8) operably connected to the first plate (7), said protective ring (8) characterized by an opening facing the first side of the transportable support assembly (1'); a handle (3) located at a predetermined handle height along the first side (35), said handle operably connected to one or more of the multiple elongated rods (9a, 9b, 9c and 9d); a first wheel (1a) and a second wheel (1b) spaced apart from the first wheel (1a) by a first predetermined distance, each of said first wheel (1a) and said second wheel (1b) operably connected to the second plate (14) along the first side (35), said first wheel (1a) and said second wheel (1b) being non-rotatable; a third wheel (2a) operably connected to the second plate (14) along the second side (36), said third wheel (2a) being rotatable; a dead man brake actuator (4) extending along at least a portion of the handle (3), said dead man brake actuator (4) in mechanical communication with the first wheel (1a) and the second wheel (1b), said dead man brake actuator (4) movable between an activated state and a deactivated state, wherein the dead man brake actuator (4) in the deactivated state is configured to prevent movement of the transportable support assembly (1') and wherein the dead man brake actuator (4) in the activated state is configured to allow movement of the transportable support assembly (1').

In a second aspect, a support assembly (1') configured to securely hold a container (11) therewithin and transport the container (11), comprising: a first clamp (15) comprising an internal opening to receive a first neck of the container (11); a retractable plunger (16) engaged into a notch (43) of first clamp (15) in a first position, the retractable plunger (16) movable between the first position and a second position, the second position defined as the plunger (16) retracted away from the first clamp (15) to allow the first neck of the container (11) to rotate; a second clamp (28) operably connected to a second plate (14), said second clamp (28) configured for receiving a second neck of the container (11), said second clamp (28) having a first portion (31) and a second portion (32), said first portion (31) pivotable between a closed position, a first open position and a second open position and said second portion (31) remaining stationary; wherein the first open position of the second clamp (28) is defined as the first portion (31) pivoted away a predetermined distance from the second portion (32) for receiving the second neck of the container (11); and wherein the second open position of the second clamp (28) is defined as the first portion (31) pivoted away from the second portion (32) to secure the second neck (32) of the container (11) to allow the second neck of the container (11) to rotate therewithin while remaining in a substantially upright position.

In a third aspect, a protective support structure (22), comprising: a first plate (7); a protective ring (8) along the first plate (7); a clamping mechanism comprising a second clamp (28) operably connected to a second plate (14) located a predetermined distance away from the first plate (7); multiple elongated rods (9a, 9b, 9c and 9d) extending between the first plate (7) and the second plate (14), each of said multiple elongated rods (9a, 9b, 9c and 9d) having a first end and a second end, each of said first ends operably connected to a corresponding first region along the periphery of the first plate (7), and each of said second ends operably connected to a corresponding second region along the periphery of the second plate (14); wherein the first plate (7), the second plate (14) and multiple elongated rods (9a, 9b, 9c and 9d) are configured to define a first side (35) of the protective support structure (22) and a second side (36) of the protective support structure (22).

In a fourth aspect, a transportable support assembly (1') configured to securely hold a container (11) therewithin, said transportable support assembly (1'), comprising: a first plate (7); a second plate (14) located a predetermined distance away from the first plate (7); multiple elongated rods (9a, 9b, 9c and 9d) extending between the first plate (7) and the second plate (14) and defining a first side (35) of the transportable support assembly (1') and a second side (36) of the transportable support assembly (1'); the first plate (7), the second plate (14) and multiple elongated rods (9a, 9b, 9c and 9d) are arranged to create a cage-like enclosure (29), said cage-like enclosure (29) adapted to receive the container (11) that can be secured to a second clamp (28) located on the second plate (14); and a protective ring (8) on the first plate (7), said protective ring (8) characterized by an opening facing the first side of the transportable support assembly (1'); a handle (3) located at a predetermined handle height along the first side (35), said handle operably connected to one or more of the multiple elongated rods (9a, 9b, 9c and 9d); a first wheel (1a) and a second wheel (1b) spaced apart from the first wheel (1a), each of said first wheel (1a) and said second wheel (1b) operably connected to the second plate (14) along the first side (35); said first wheel (1a) and said second wheel (1b) being non-rotatable; a third wheel (2a) and fourth wheel (2b) operably connected to the second plate (14) along the second side (36), said third wheel (2a) and fourth wheel (2b) being rotatable; and a braking mechanism in mechanical communication with at least the first wheel (1a) and the second wheel (1b).

In a fifth aspect, a transportable support assembly (1') configured to load and securely hold a neck of a container (11), said transportable support assembly (1'), comprising: a cage-like enclosure (29) comprising a first side, a second side and a first end and a second end; a clamping mechanism affixed to the first end or the second end of the cage-like enclosure, said clamping mechanism comprising a pivotable portion (31) and a complementary fixed portion (32) engaged to the pivotable portion (31), said pivotable portion (31) movable between a closed position, a first open position and a second open position; wherein said closed position is defined as the pivotable portion (31) abutted with the complementary fixed portion (32) to form an opening for securing the neck of the container (11) within the opening, said opening of the closed position further characterized as having a protruded section (48) along each of the inner surfaces of the pivotable portion (31) and the complimentary fixed portion (32) which are adapted to engage with a recessed region (47) of the neck of the container (11), respectively; wherein said first open position is sized to allow the neck of the container (11) to be mounted therewithin or dismounted from therewithin; wherein said second open position is smaller than the first open position and sized to receive the neck of the container (11) to rotate therewithin while remaining substantially upright.

In a sixth aspect, an adjustable clamping mechanism for securing an end of a container, comprising: an adjustable clamp (28) comprising a stationary portion (32) and a pivotable portion (32); the stationary portion (32) operably connected to a plate (14); the pivotable portion (31) having a single point of attachment (38) to the stationary portion (32); a latch (17) operably connected to the pivotable portion (31), said latch (17) comprising arms (75); a latch keeper (76) operably connected to the stationary portion (32); the pivotable portion (31) configured to move into a fully engaged and closed position characterized by arms (75) interlocked with the keeper (76) whereby the stationary portion (32) is abutted against the pivotable portion (31) so as to create an internal opening of the adjustable clamp (28) that is fully enclosed by the stationary portion (32) and pivotable portion (31) both of which create a protruded section (48) into the internal opening that is sized to lock the end of cylinder (11); the pivotable portion (31) configured to move into a first disengaged position characterized by arms (75) fully removed from latch keeper (76) so to create the adjustable clamp (28) having a first open position for receiving and mounting the neck of the container into the first open position; the pivotable portion (31) configured to move into a second disengaged characterized by arms (75) partially or fully removed from the latch keeper (76) so to create the adjustable clamp (28) having a second open position defined at least in part by a restrictor (24) operably connected to the pivtoable portion (32) and the stationary portion (32), said restrictor (24) limiting the amount that the pivotable portion (31) pivots away from the stationary portion (32) to create the second open position for allowing the neck of the cylinder (11) to rotate within the second open position while remaining substantially upright.

BRIEF DESCRIPTION OF THE DRAWINGS

The objectives and advantages of the invention will be better understood from the following detailed description of the preferred embodiments thereof in connection with the accompanying figures wherein like numbers denote same features throughout and wherein:

FIGS. 2a, 2b, 2c and 2d show, among other structural features, an enlarged view of the arrangement of the cylinder and the first clamp and first plate at the first end at the top of the assembly, in accordance with the principles of the present invention;

FIGS. 3a, 3b and 3c show an enlarged view of the arrangement of the first plate and the first end of cylinder at the top of the assembly, in accordance with the principles of the present invention;

DETAILED DESCRIPTION OF THE INVENTION

Figure 1:
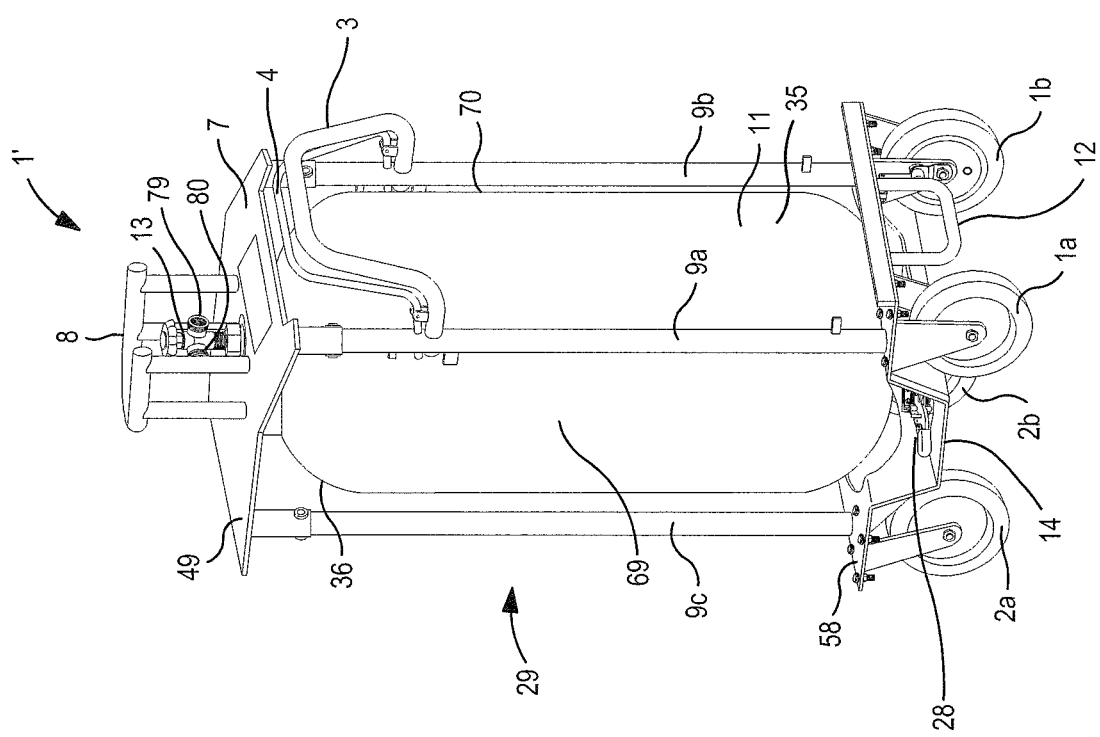
FIG. 1 shows an overall schematic of an exemplary transport support assembly with wheels, handle and a braking mechanism and a cylinder securely mounted within the frame assembly of the transport support assembly, in accordance with the principles of the present invention.

The relationship and functioning of the various elements of this invention are better understood by the following detailed description. The detailed description contemplates the features, aspects and embodiments in various permutations and combinations, as being within the scope of the disclosure. The disclosure may therefore be specified as comprising, consisting or consisting essentially of, any of such combinations and permutations of these specific features, aspects, and embodiments, or a selected one or ones thereof.

In the drawings, like numerals indicate like elements throughout. Certain terminology is used herein for convenience only and is not to be taken as a limitation on the present invention.

The terminology includes the words specifically mentioned, derivatives thereof and words of similar import. The embodiments illustrated below are not intended to be exhaustive or to limit the invention to the precise form disclosed. The invention may include any of the following embodiments in various combinations and may also include any other aspect described below in the written description or in the attached drawings. These embodiments are chosen and described to best explain the principle of the invention and its application and practical use and to enable others skilled in the art to best utilize the invention.

As used and throughout, the term "container" is intended to mean any type of storage, filling and/or dispensing vessel, including but not limited to, cylinders, dewars, bottles, tanks, barrels, bulk and microbulk, which are suitable for filling, storing, transporting, and/or delivering materials, including gases and liquefied gases.

The terms "operably connected" and "connected" may be used interchangeably herein and throughout and are intended to mean a direct or indirect connection between two or more components by way of mechanical, chemical and/or electrical communication between the two or more components.

As used herein and throughout, unless indicated otherwise, all concentrations are expressed as volumetric percentages ("vol %").

As used herein and throughout, "about" or "approximately" when referring to a measurable value such as an amount is meant to encompass variations of ±20%, ±10%, ±5%, ±1% and ±0.1% from the specified value, as such variations are appropriate.

Throughout this disclosure, various aspects of the invention can be presented in range format. It should be understood that the description in range format is merely for convenience and brevity and should not be considered as a limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

It should be noted, by way of example, and in connection with the Figures, a "first end" refers to a top of the assembly (1') and a "second end" refers to a bottom of the assembly (1'). However, it should be understood that various design variations are contemplated such that the "first end" may refer to a bottom of assembly (1') and "second end" may refer to a top of the assembly (1'); or the "first end" and the "second end" may each represent another end of the assembly (1') relative to each other.

It should be also noted that, by way of example, and in connection with the Figures, a "first side" of the assembly (1') represents a user-side, which is a location where a user can hold the handle (3) to maneuver and transport the assembly (1'); and a "second side" represents a rear side of the assembly (1') which is substantially diametrically opposed to the first side (35) of the assembly (1'). However, it should be understood that various design variations are contemplated such that the "first side" may refer to the rear side of assembly (1') and "second side" may refer to a user side of the assembly (1;); or the "first side" and the "second side" may each represent a different side or region of the assembly (1') relative to each other.

A "third side" and "fourth side" are intended to be regions extending between the "first side" and "second side".

In view of the lack of a suitable mobile storage apparatus, the present invention has emerged. Referring to FIG. 1, the disclosure in one aspect relates to a transportable support assembly (1') configured to securely hold and move a container (11) on the assembly (1') with improved maneuverability and stability. Preferably, the container (11) is a cylinder. The transportable support assembly (1') includes a frame structure. The frame structure provides a cage-like enclosure (29) that serves as a protective opening for the cylinder (11). The cage-like structure (29) is formed from multiple elongated rods. In one embodiment, a total of four elongated rods are utilized, namely elongated rods (9a), (9b), (9c) and (9d). The arrangement of each of the elongated rods (9a), (9b), (9c) and (9d) creates an opening that is sized to receive the cylinder (11). Elongated rod (9d) can be seen in FIG. 4a. Referring to FIG. 1, elongated rod (9d) is located behind elongated rod (9b) into the plane of the paper, and as a result is not visible.

For purposes of describing the embodiments in connection with the Figures, the first side (35) is bounded by elongated rods (9a) and (9b); the second side (36) is diametrically opposed to the first side (35) where the second side (36) is bounded by elongated rods (9c) and (9d); the third side (69) is bounded by elongated rods (9a) and (9c); and a fourth side (70) is diametrically opposed to third side (69) where the fourth side is bounded by elongated rods (9b) and (9d).

The multiple elongated rods (9a, 9b, 9c and 9d) extend between a first plate (7) and a second plate (14). In one embodiment, and referring to FIG. 1, the first plate (7) is located above the second plate (14). The first plate (7) is angled in a downward direction towards the first side 35 (e.g., user side) in an amount sufficient to create clearance for a user to access the valve 13 of cylinder (11). In particular, referring to FIG. 1, a first end of each of the four elongated rods (9a, 9b, 9c 9d) is operably connected to a corresponding first region along the peripheral region (49) of the first plate (7), and a second end of each of the four elongated rods (9a, 9b, 9c, 9d) is operably connected to a corresponding second region along the peripheral region (58) of the second plate (14). The elongated rods (9a, 9b, 9c, 9d) create a frame structure that is substantially upright, and substantially aligned with the longitudinal axis of the cylinder (11) when mounted and secured therein. In this manner, the vertical alignment of the frame structure of assembly (1') with the cylinder (11) can minimize any tendency for tipping of the assembly (1') and enable the assembly (1') with cylinder (11) mounted and secured therein to be transported and maneuvered with stability by a user.

Any suitable shape, material and wall thickness is contemplated so as to impart the necessary structural integrity to the assembly (1'), which requires passing the requisite drop test in accordance with ISO 11117:1998(E), as will be explained in greater detail in the Examples. The four elongated rods (9a, 9b, 9c and 9d) preferably are tubular. The tubular structures may be formed from various suitable materials (e.g., stainless steel, carbon steel, or aluminum) with varying suitable inner diameter (e.g., 0.5-2.5 inches) and varying suitable outer diameter (e.g., 0.5-2.5 inches) so as to impart the required structural integrity to the assembly (1').

The arrangement of the cylinder (11), first clamp (15) and first plate (7) at the first end, in accordance with the principles of the present invention, will now be discussed. FIGS. 2a, 2b, 2c and 2d show, among other structural features, an enlarged view of the spatial relationship between first plate (7); first clamp (15) with a retractable, spring-loaded plunger (16); and the first end of the cylinder (11). Consistent with FIG. 1, the first end as shown in FIGS. 2a, 2b, 2c and 2d refers to the top of the assembly (1'), which includes the first neck of cylinder (11), the first plate (7) and the first clamp (15). The first clamp (15) as shown in FIGS. 2b and 2c is spaced below the first plate (7) and not attached to the first plate (7), thereby allowing the first clamp (15) to rotate without any restriction or interference from the first plate (7) or the secondary structure (41) of first plate (7). The first end of cylinder (11) extends through the inner opening in the first clamp (15); the inner opening of the secondary structure (41) of the first plate (7); and the opening in the first plate (7). A ring-like polymeric material 42 (e.g., Delrin®, commercially available from DowDupont™) is located within the inner surface of the first plate (7) (FIGS. 3b and 3c). The ring-like polymeric material (42) extends through opening of first plate (7) and the secondary structure (41) of the first plate (7) and is attached onto the first plate (7) as shown in FIG. 3b. The ring-like polymeric material (42) extends around first end of cylinder (11) to support and maintain the cylinder (11) along the first end in a substantially upright position. The outer surface of the first neck of the cylinder (11) contacts the ring-like polymeric material 42 when the cylinder (11) is fitted into the inner opening of first plate (7).

The first clamp (15) as shown in FIG. 2c engages with a retractable, spring-loaded plunger (16) to maintain its position after having been installed into the correct position around the first end of the neck of cylinder (11). A side of the first clamp (15) is shown abutted to the retractable, spring-loaded plunger (16) in its unbiased state. The plunger (16) is located within a complimentary notch (43) located at a predetermined position along the side of the first clamp (15). In the engaged configuration, the plunger (16) prevents the first clamp (15) and first end of neck cylinder (11) situated within opening of first clamp (15) from rotating.

The retractable, spring-loaded plunger (16) can be pulled by a user when the cylinder (11) needs to be rotated for visual inspection or for other purposes which may arise during use and/or maintenance. A user can pull the plunger (16) away from the first clamp (15) until the tip-most portion of plunger (16) has been pulled away from the edge of notch (43), thereby entirely removing the plunger (16) from notch (43) and allowing the cylinder (11) within the first clamp (15) to rotate with the first clamp (15), so long as the second end of the cylinder (11) is also configured to rotate (the mechanism for which will be discussed below). Referring to FIG. 2d, the plunger (16) when retracted away from notch (43) can be rotated about 90 degrees and placed onto a ledge-like structure (44) (shown in FIG. 2d) of first clamp (15), where the retracted plunger (16) can remain rested in such position out from notch (43). FIG. 2b shows that ledge-like structure (44) is connected to secondary structure (41) of first plate (41). With the plunger (16) retracted, the cylinder (11) and first clamp (15), by virtue of not being attached to the first plate (7) or the secondary structure of first plate (41), is free to rotate with the first clamp (15) while still remaining securely mounted within the opening of first clamp (15) at the first end of assembly (1'). The ring-like polymeric material (42) between the first end of outer surface of neck of cylinder (11) and inner opening of the first plate (7) provides sufficient stability and support which prevents the cylinder (11) from undesirably tilting during rotational movement.

After rotation of the cylinder (11) has been completed, a user can release plunger (16) from its resting position on ledge-like structure (44) so that it reseats into notch (43) as shown in FIG. 2c. The plunger (16) engagement into notch (43) of first clamp (15) ensures that the cylinder (11) is locked into its unbiased and correct orientation, where the correct orientation, as will be further explained hereinbelow, requires the user port (79) of valve (13) to be facing the first side (35) of assembly (1') such that a user can access user port (79) and fill port (80) of valve (13) through opening of protective ring (8) without obstruction or interference of protective ring (8).

FIGS. 3a, 3b and 3c show an enlarged view of the spatial arrangement of the first plate (7) and the first end of cylinder (11) at the top of the assembly (1'). FIG. 3a shows the first end of cylinder (11) extending through an opening of first plate (7). A gap exists between the first end of cylinder (11) and the opening of first plate (7). The gap provides sufficient clearance for the cylinder (11) to rotate as well as undergo thermal expansion. For purposes of clarity for viewing such gap, the attachment of ring-like polymeric material 42 onto first plate (7) has been omitted from FIG. 3a.

FIG. 3b shows the ring-like polymeric material 42 extending through the gap and attached onto the first plate (7). FIG. 3c shows a corresponding cross-sectional view of the first end of cylinder (11) in spatial relation to first plate (7) and secondary structural support of first plate (41) below first plate (7) with ring-like polymeric material 42 extending around the first end of neck of cylinder (11). The ring-like polymeric material 42 is shown located within the inner opening of the first plate (7). For purposes of showing the relative orientation of polymeric material (42) to the first end of cylinder (11), the first plate (7) and secondary structural support of first plate (41) in FIG. 3c are shown as a single component.

The secondary structure (41) below the top plate (7) is preferably utilized to absorb at least a portion of the stresses created should the cylinder (11) mounted on assembly (1') tilt or fall.

Figure 4A:
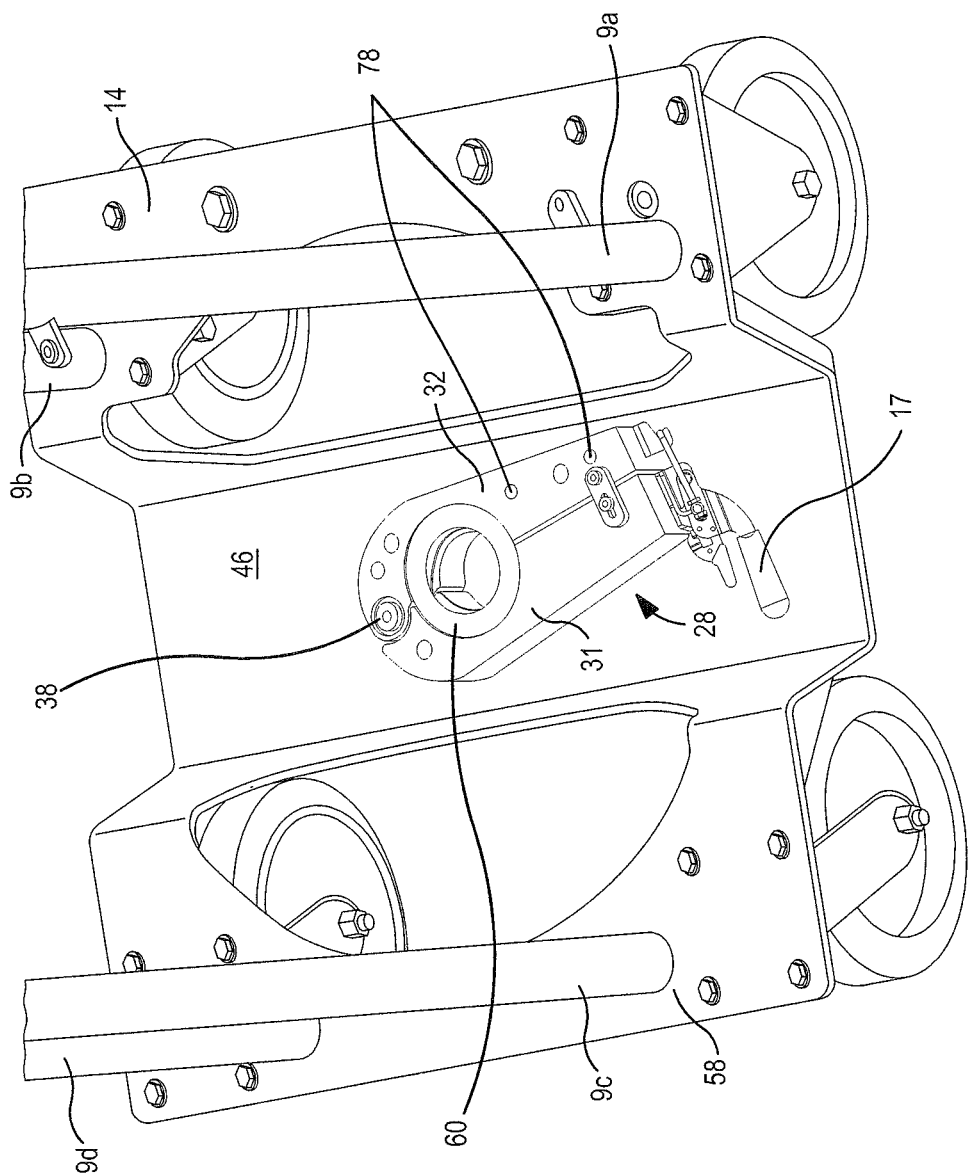
FIG. 4a shows a second plate with second clamp in the closed position.

FIG. 4a shows a second plate (14) is located a predetermined distance away from the first plate (7). The second plate (14) is substantially vertically aligned with the first plate (7). The predetermined distance between the second plate (14) and the first plate (7) defines the height of the frame structure into which a specific size cylinder (11) can be mounted. The second plate (14) has a peripheral region (58) that serves as a support platform for connection of elongated rods (9a, 9b, 9c and 9d).

Unlike the first end, the neck of the cylinder (11) at the second end when mounted and secured in assembly (1') is mechanically attached onto a second clamp (28). FIG. 4a shows a second clamp (28) that is connected to the second plate (14) along a central region (46) of the second plate (14). The central region (46) is recessed and centrally located relative to a peripheral region (58) of second plate (14). The second clamp (28) in the closed position (FIG. 4a) fully encloses and secures the second end of neck of cylinder (11) into the assembly (1').

The second clamp (28) has two components which include a first portion (31) and a second portion (32) that is separate and distinct from the first portion (31). The first portion (31) is movable into a first open position (FIGS. 4b and 4c) for mounting the second end of cylinder (11). The first portion (31) is also moveable into a second open position (FIGS. 4d, 4e and 4f) for rotating the second end of cylinder (11) in a secured manner, as may be required for visual inspection. The second open position is smaller than the first open position. The second portion (32) of second clamp (38) as shown in FIG. 4a remains stationary and is connected (e.g., by using a mechanical connection means such as bolts 78) to the second plate (14). The closed position of second clamp (28) fully encloses and locks a recessed region 47 of neck of cylinder (11) along its second end (as will be explained with regards to FIGS. 5a and 5b).

The first portion (31) of the second clamp (28) is attached to the second portion (32) with a pin-like structure (38), which creates a point of attachment for the first portion (31) of second clamp (28) to pivot relative to the second portion (32). First portion (31) pivots between a first open position (FIGS. 4b and 4c), a second open position (FIGS. 4d, 4e and 4f) and a closed position (FIG. 4a).

Figure 4B:
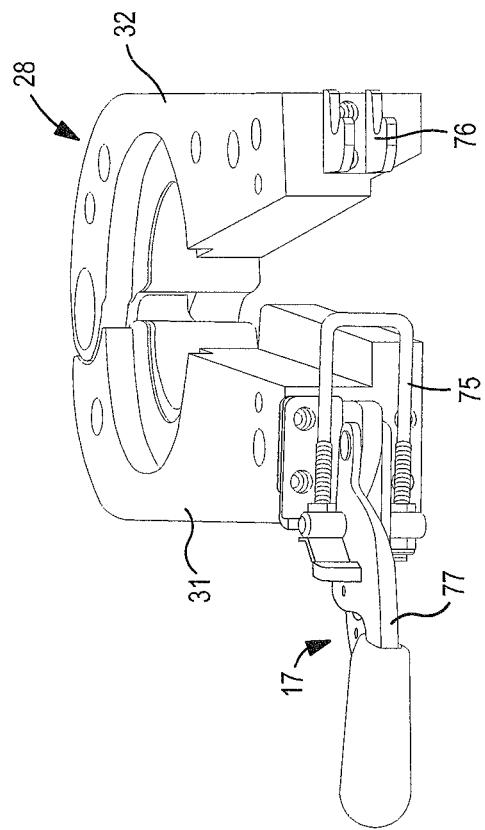
FIG. 4b shows an enlarged view of the latch fully disengaged from the keeper and with restrictor removed from top of second clamp to allow the second clamp to be configured into the first open position that is sized to allow cylinder to be mounted therein.
Figure 4G:
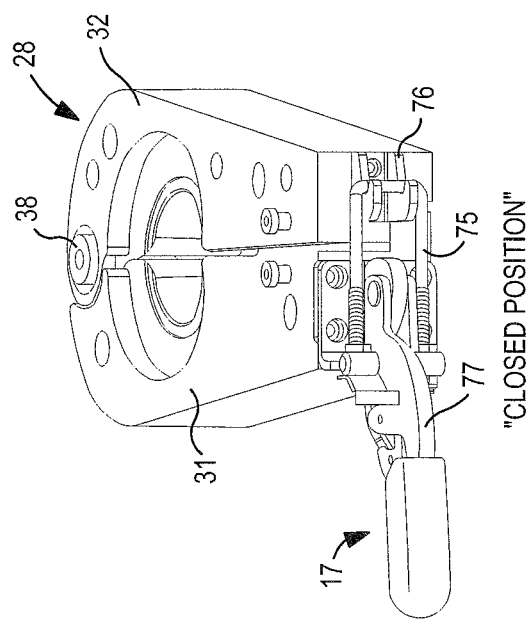
FIG. 4g shows the latch arms of latch fully engaged into the latch keeper to cause the second clamp to be in the closed position.
Figure 4C:
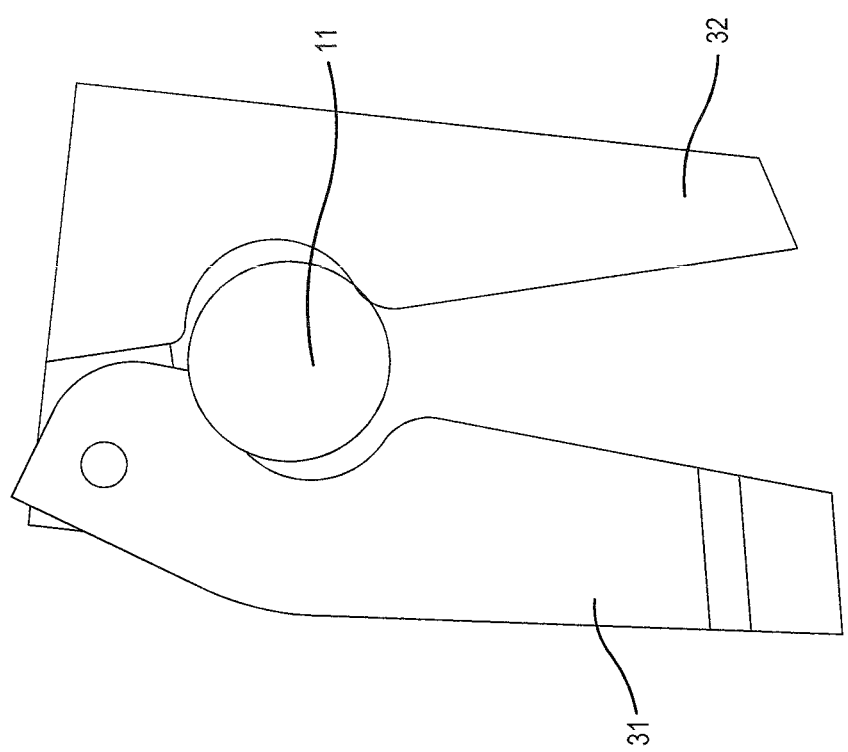
FIG. 4c shows a top view of second clamp of FIG. 4b.
Figure 4D:
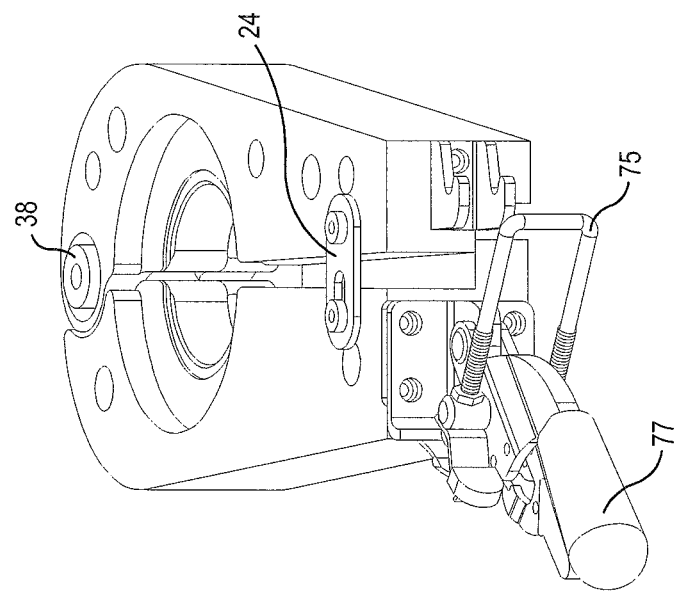
FIGS. 4d, 4e and 4f show the second clamp in the second open position sized to allow a cylinder to be rotated therein.
Figure 4F:
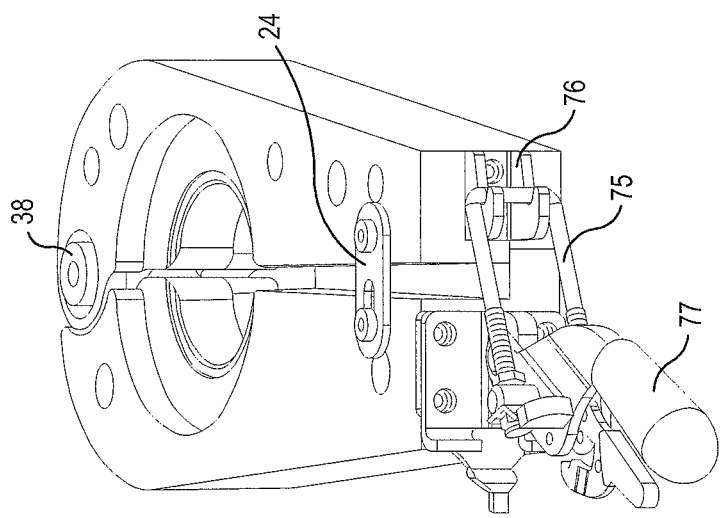
Figure 4E:
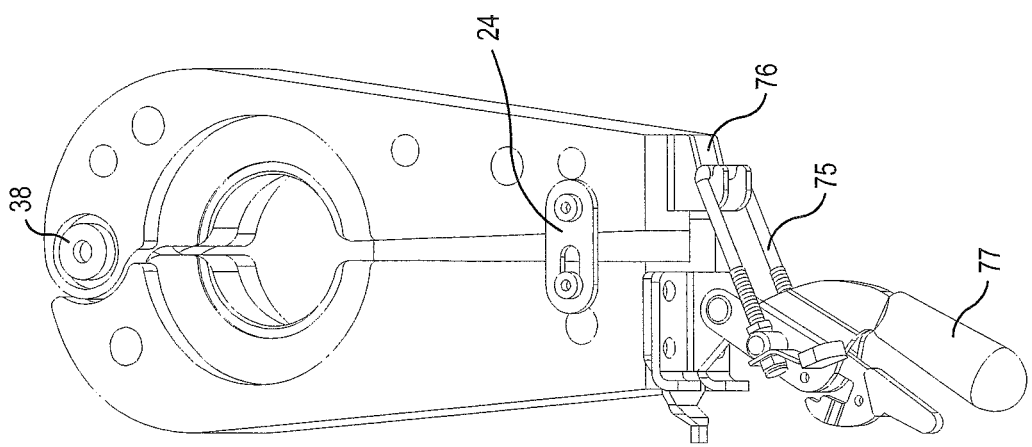

Referring to FIGS. 4b, and 4d-4g, a latch (17) is utilized to be able to pivot the first portion (31). The latch (17) includes a latch arm (75); a latch keeper (76); and a latch handle (77). The latch arm (75) and the latch handle (77) are connected to the edge of first portion (31). The latch keeper (76) is connected to the edge of second portion (32). In the closed position of second clamp (28), the latch arms (75) are fully engaged into the latch keeper (76) as shown in FIG. 4g causing the internal opening of second clamp (28) to be fully enclosed. Handle (77) extends outward in close proximity towards the edge of the second plate (14) to allow access by an end-user (FIG. 1). The handle (77) can be grasped by an end-user. The handle (77) can be outwardly pulled in the manner shown in FIGS. 4d, 4e and 4f to cause the first portion (31) to pivot away from the second portion (32) to create the second open position (FIGS. 4d, 4e and 4f), which represents an opening that allows the second end of cylinder (11) to rotate within the second open position while still remaining in a substantially upright position. A restrictor (24) limits the amount that the second clamp (28) can open and remains on second clamp (28) during operational use. As a result, FIGS. 4d, 4e and 4f show the second clamp (28) opened by the same amount (i.e., configured into the second open position), even though the handle (77) has been pulled outwardly by differing amounts.

As an additional feature, to help minimize the amount of friction between the second end of the cylinder (11) and the second clamp (28), a ring-like polymeric material (60) can be inserted within second clamp (28). The ring-like polymeric material (60) is shown in FIG. 4a. The reduction in friction facilitates rotation by user. In one example, the ring-like polymeric material (60) includes two washers that are inserted into a recessed section in the second clamp (28) as shown in FIG. 4a. One of the washers is preferably made of Delrin® and the other washer is preferably made from Nylon®. Other materials suitable for reducing friction can be employed.

The restrictor (24) is removed as shown in FIGS. 4b and 4c when mounting a cylinder (11) into the opening of second clamp (28) or removing the cylinder (11) from the opening of second clamp (28). With the removal of restrictor (24), latch handle (77) can be pulled outwardly in the manner shown in FIG. 4b to cause the first portion (31) to pivot away from the second portion (32) a greater amount than shown in FIGS. 4d, 4e and 4f to create the required first open position, which is larger than the second open position.

By eliminating nuts and bolts as typically required to fasten first portion (31) of second clamp (28) onto second plate (14), substantial user time and effort is avoided. Conventional clamping mechanisms require loosening the first portion (31) of second clamp (28) from the second plate (14) to mount and dismount the cylinder (11). The present invention avoids the need to loosen the first portion (31) of second clamp (28). In comparison to conventional cylinder clamping mechanisms, the latch mechanism of the present invention can relatively quickly and with ease re-orient the second clamp (28) into the precise and desired opening for mounting or dismounting a cylinder (11) or rotating the cylinder (11).

Figure 5C:
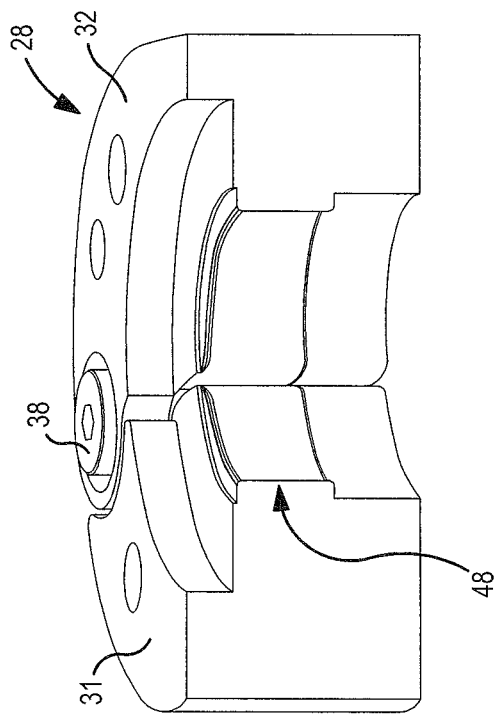
FIG. 5c shows the protruding section of second clamp along the inner surfaces of the first portion and the second portion of the second clamp.
Figure 5A:
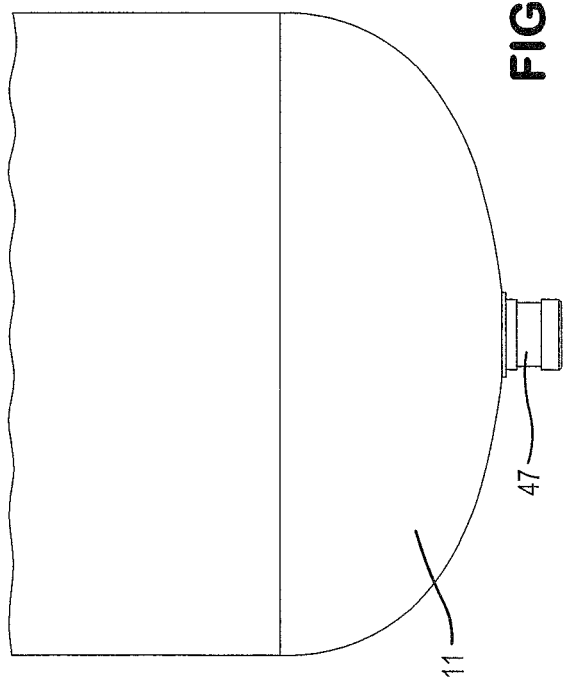
FIG. 5a shows the neck of cylinder having a recessed region which is designed to mate and fit within a complimentary protruded section of second clamp at the second end of the assembly.
Figure 5B:
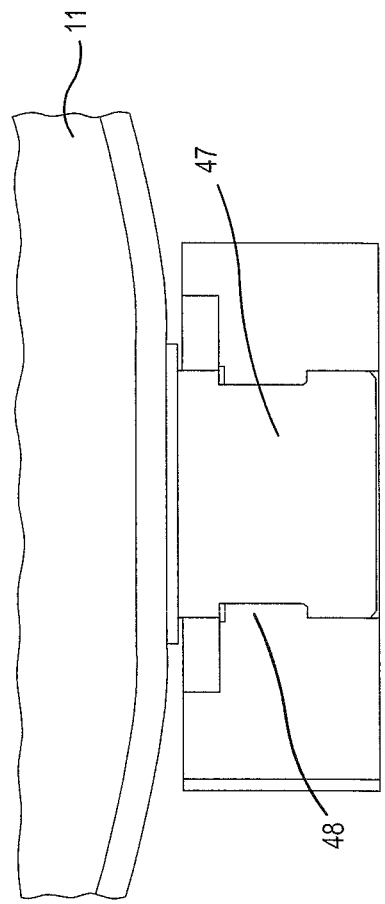
FIG. 5b shows a cross section of the neck of cylinder having a recessed region engaged with the protruded section of second clamp at the second end of the assembly.

To ensure a secure fit of the cylinder (11) to the assembly (1'), the second clamp (28) has a protruded section (48) along each of the inner surfaces of the first portion (31) and second portion (32), respectively, that is designed to mate and fit with a complimentary recessed region 47 (FIG. 5a) of the second neck of cylinder 11 and create a so-called "lock and key" mechanism as shown in the cross-sectional view of FIG. 5b. FIG. 5c shows the recessed region 47 in the neck of cylinder 11, which is designed and fabricated to fit into the corresponding protruded section (48) along inner surfaces of the second clamp (28) without requiring sole reliance on the so-called "squeeze force" of the second clamp (28) on the neck of cylinder 11 at its second end. The inventors have discovered that the combination of a squeeze force with the lock and key mechanism created from protruded section (48) provides a mechanical advantage that allows the cylinder (11) to be sufficiently locked into second clamp (28) with the use of the latch mechanism of the present invention. The present invention recognizes that the absence of protruded section (48) from the latch mechanism fails to create a sufficient clamping force for securing second end of cylinder (11). Additionally, conventional clamping mechanisms not utilizing a latch mechanism have been limited to relying solely on the squeeze force to secure cylinders. However, the present invention, in comparison to conventional clamping mechanisms, offers an improved, quick-release clamping mechanism that uses a combination of a squeeze force with a lock and key mechanism to generate the requisite clamping force. In this regard, when the first portion (31) of second clamp (28) is configured to close around the recessed region of neck (47) of cylinder (11), the cylinder (11) is sufficiently locked into position and can be held in such locked orientation even if the frame structure (22) is inverted, as demonstrated by inventors.

One of the unique benefits of the present invention is that the configuration of the first end of cylinder (11) and the second end of cylinder (11) mounted within the support assembly (1') allows the cylinder (11) to rotate for visual inspection while still being maintained substantially upright. The method for allowing the rotation will now be described. One of the requirements necessary for rotation of the cylinder (11) is to configure the second clamp (28) from the closed position of FIGS. 4a and 4g, into the second open position of FIGS. 4d, 4e and 4f to create sufficient clearance for recessed region (47) of neck of cylinder 11 to rotate therewithin. In this regard, latch (17) is pulled by a user, and first portion (31) pivots away from second portion (32) to create the second open position shown. The restrictor (24) operably connects the first portion (31) to the second portion (32) of second clamp (28), thereby ensuring that an end-user cannot inadvertently pull latch 17 to open the second clamp (28) beyond second open position (FIG. 4d) into the first open position (FIGS. 4b and 4c), which can cause cylinder (11) to tilt and/or fall out of assembly (1').

With the second clamp (28) configured by user into the second open position (FIG. 4d), the retractable, spring-loaded plunger (16) at the first end can be pulled by a user. A user can pull the plunger (16) until the tip-most portion of plunger (16) has been pulled away from notch. Referring to FIG. 2d, the plunger (16) when retracted away from notch (43) can be rotated 90 degrees and then placed onto the edge of a ledge-like structure (44) of first clamp (15) and remain rested on the ledge-like structure (44) until a user is ready to release it back into the notch (43). With the plunger (16) retracted in this manner, the cylinder (11) by virtue of not being attached to the first plate (7) or the secondary structure of first plate (41) is able to rotate within opening of the first plate (7) at the first end while still remaining securely mounted within the opening of first plate (7). The ring-like polymeric material 42 between the first end of cylinder (11) and first plate (7) along the top section of assembly (1') provides sufficient stability and support which prevents the cylinder (11) from undesirably tilting at its first end during the rotational movement.

Having retracted plunger (16) away from first clamp (15) the first end of the cylinder (11) along with the first clamp (15) are free to rotate within first plate (7). The cylinder (11) is ready to be rotated freely by a user at its first and second ends, while maintaining secured in the assembly (1'). The user can apply a torque to the walls and rotate the cylinder (11) without risk of the-recessed region (47) of the neck of the cylinder (11) tilting or falling out of its substantially upright position within the second clamp (28) as a direct result of the novel clamping mechanism of the present invention. The tilting or falling out of cylinder (11) is a potentially dangerous condition that can prevent second clamp (28) from properly closing around the recessed region (47) of neck of second end of cylinder (11).

After the cylinder (11) has been rotated for visual inspection or as may be required for other purposes, both ends of the cylinder (11) are re-engaged to the first end and second end of assembly. User pushes handle (77) such that latch arm (75) re-engages into corresponding slots of latch keeper (76) (FIGS. 4a and 4g) to secure recessed region (47) of second end of cylinder (11) into second clamp (28). User further releases plunger (16) from ledge (44) so that plunger (16) reseats into notch (43) along the side of first clamp(15) (FIGS. 2c and 2d). FIG. 2b shows that plunger (16) can be threaded into ledge-like structure (44) when plunger (16) is seated in notch (43).

The first clamp (15) is specifically positioned such that the notch (43) along the side of the first clamp (15) causes plunger (16) to always reseat in a cylinder orientation where the user port and fill port of valve (13) is positioned as shown in FIG. 1. Specifically, referring to FIG. 1, the user port (79) on the valve (13) faces the opening in the protective ring (8) towards the first side (35) to allow a user to readily access the valve (13) without interference from pillars of protective ring (8), thereby allowing, for example, connection to a regulator onto the user port (79) for dispensing gas product from interior of cylinder (11). Additionally, the fill port (80) is oriented to allow user access without interference from pillars of protective ring (8) (e.g., the fill port (80) is oriented towards third side (69) between pillars of ring (8)). If the plunger (16) were to re-engage in a position where fill port and/or user port is obstructed, the user may encounter difficulties with installation of the regulator onto the valve (13) as required to dispense the product. Accordingly, the selectivity involved with locking the first end of cylinder (11) in a specific orientation that does not obstruct access and use of the user port (79) and fill port (80) is a unique design attribute taken into account by the present invention.

It should be understood that the order of the steps for allowing rotation of cylinder (11) as well as locking cylinder (11) into assembly (11') can be varied. For example, it should be understood that the plunger (16) may be retracted from notch (43) of first clamp (15) before pulling latch (17) and configuring second clamp (28) into the second open position. Additionally, the first end of cylinder (11) may be secured with release and reseat of plunger (16) into notch (43) prior to configuring the second clamp (28) into the closed position.

A protective ring (8) is shown attached to the first plate (7). The protective ring (8) partially encapsulates a valve (13) of the cylinder (11), which serves, at least in part, to protect the valve (13) from rupture or other damage in the event the cylinder (11) or a top portion thereof, when mounted into the transportable support assembly (1'), falls onto another surface. The protective ring (8) is designed to absorb at least a portion of the impact of such a fall, thereby preventing damage to the valve (13). Actual drop tests of the support frame assembly (1') (which include elongated rods (9a, 9b, 9c and 9d); first plate (7); first clamp (15); second plate (14); second clamp (28); and protective ring (8)) performed by inventors demonstrated that the structural integrity of the valve (13) can be maintained without damage even when the assembly (1') is dropped from a height of 6 feet and the longitudinal axis of the cylinder (11) at an angle of 30° to the vertical, pursuant to International Standard Organization ("ISO") 11117:1998(E), which represents a worst case scenario where the impact force is substantially focused on a single point of the protective ring (8). The so-called drop tests revealed that the assembly (1') can prevent damage to the valve (13) and neck of cylinder (11) along the first end. The assembly (1') is capable of protecting the valve (13) upon such drops such that insubstantial displacement of the first end of neck of cylinder 11 along the top thereof is observed.

Various designs for the protective ring (8) are contemplated. In one example, the protective ring (8) is designed to have a substantially u-shaped bend with an opening extending towards the first side 35 of assembly (1') towards the user side. The opening in the protective ring (8) allows a user to access the valve (13). The Figures show that the u-shaped bend is situated along the first plate (7) and extends approximately 270° around the valve (13).

The wheels as shown in FIG. 1 are operably connected to the second plate (14) along a peripheral region (58) of the second plate (14). A first wheel (1a) and a second wheel (1b) are provided along a first side (35) of the assembly (1'). The first wheel (1a) and the second wheel (1b) are spaced apart from each other by a predetermined distance that is sufficient to minimize tipping of the assembly (1'). To enhance maneuverability of the assembly (1'), the first wheel (1a) and the second wheel (1b) are non-rotatable.

The assembly (1') also includes a third wheel (2a) and a fourth wheel (2b) along a second side (36) of the assembly (1'), where the second side (36) preferably and as shown in FIG. 1 is diametrically opposed to the first side (35). The third wheel (2a) and the fourth wheel (2b) are spaced apart from each other by a predetermined distance that is sufficient to minimize tipping of the assembly (1'). In a preferred embodiment, the third wheel (2a) and the fourth wheel (2b) are spaced apart by the same distance as that of the first wheel (1a) and the second wheel (1b). The third wheel (2a) and the fourth wheel (2b) are preferably rotatable while the first wheel (1a) and the second wheel (1b) are non-rotatable. Such a combination allows a user to tip the assembly (1') with stability and increased maneuverability. The present invention recognizes that if the user is holding the handle (3) and tipping the cylinder (3), the cylinder (3) can actually start to move or at minimum exhibit a tendency to move if the first wheel (1a) and second wheel (1b) can rotate.

Accordingly, the preferred design employs a first wheel (1a) and second wheel (1b), both of which are non-rotatable. A foot ledge (12) is shown in FIG. 1 secured to the second plate (14) along the first side (35). The foot ledge (12) is located below the second plate (14) and extends towards ground level. The foot ledge (12) is located between the first wheel (1a) and the second wheel (1b). The user can grab handle (3) along first side (35) and place a foot on foot ledge (12) located at second end of second plate (14) and tip the assembly (1) along first wheel (1a) and second wheel (1b) towards user in a stable manner as a result of the first wheel (1a) and second wheel (1b) remaining non-rotatable. Such tipping of assembly (1') with use of the foot ledge (12) is advantageous when maneuvering and transporting the assembly (1) over a ridge or other type of surface irregularity on the ground which can create an uneven surface.

It should be understood that any diameter for the wheels (1a, 1b, 2a and 2b) are contemplated. Preferably all wheels (1a, 1b, 2a and 2b) are the same diameter. However, the first wheels (1a and 1b) may be a different diameter than the second wheels (2a and 2b).

The assembly (1') also includes a handle (3) along the first side (35). The handle (3) has a horizontal portion extending between a first elongated rod (9a) and a second elongated rod (9b). Each end of such horizontal portion extends downwards a sufficient amount and then attaches to the first elongated rod (9a) and the second elongated rod (9b). The vertical portions of handle (3) span a sufficient range to allow a range of users of differing height levels to grasp along the vertical portions with relative ease to hold, move and maneuver the assembly (1').

A braking mechanism is utilized to increase safety when transporting assembly (1') with cylinder (11). In a preferred embodiment, the assembly (1') utilizes a dead man braking mechanism. The dead man braking mechanism maintains the brakes on the wheels at all times, until a user chooses to squeeze the dead man actuator towards handle (3). As such, the deactivated state means the brakes are applied onto the wheels and the activated state means the brakes are not applied onto the wheels. Such a braking mechanism eliminates the risk of a user transporting an unsecured cylinder (11) within frame structure of assembly (1').

Figure 6B:
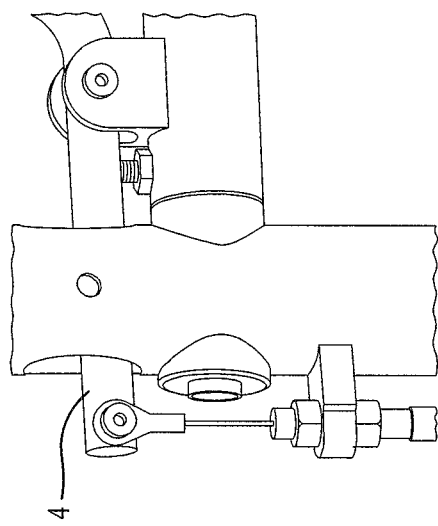
FIGS. 6a, 6b, 6c show the outer components of the dead man brake mechanism.
Figure 6C:
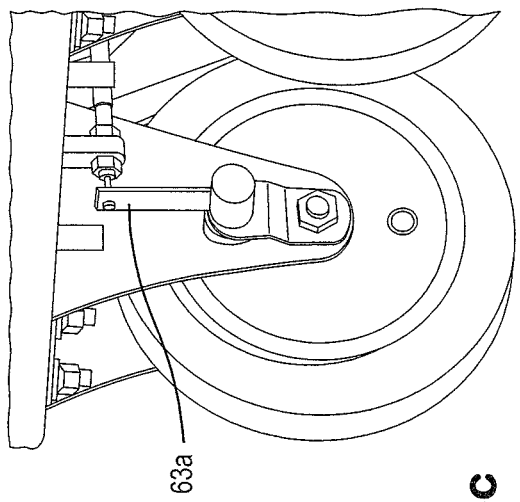
Figure 6A:
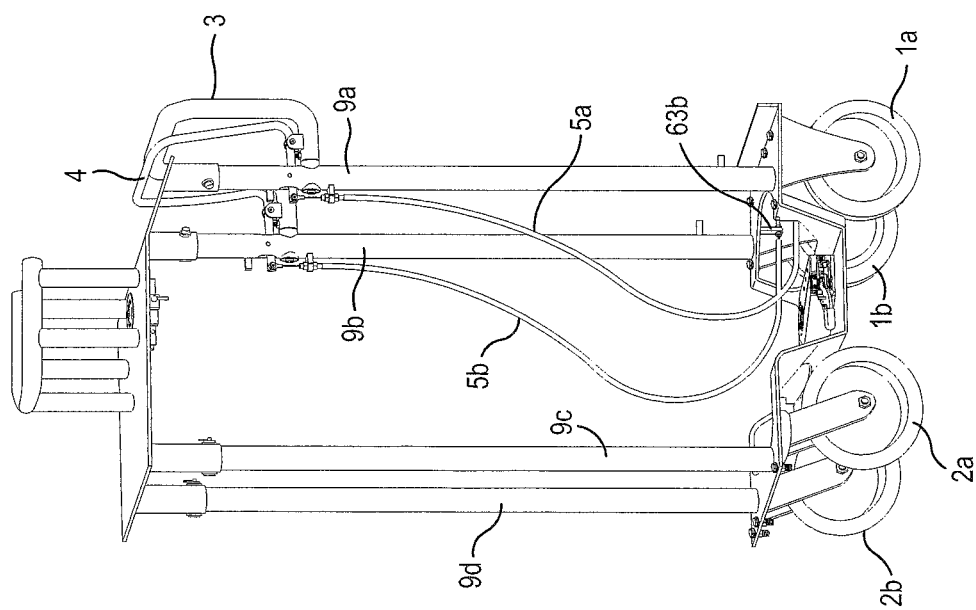
Figure 7B:
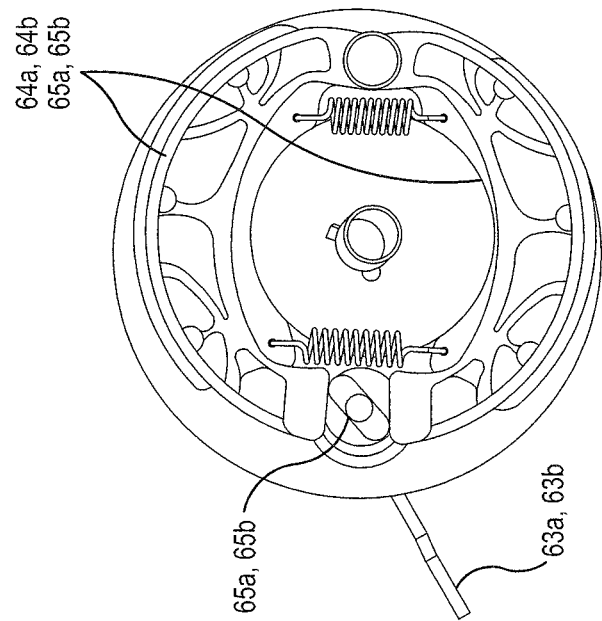
FIGS. 7a and 7b show the inner components of the braking mechanism within a wheel.
Figure 7A:
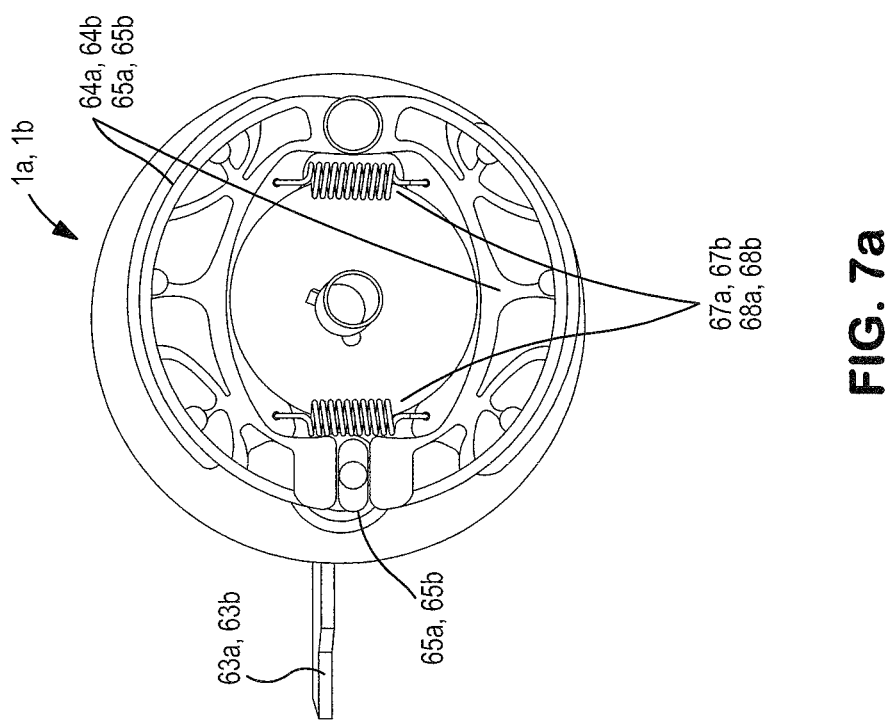

FIG. 1 and FIG. 6a show a dead man brake actuator (4) that extends along a portion of the handle (3). Referring to FIG. 6a, one end of the actuator (4) is connected to a first brake cable (5a); and another end of the actuator (4) is connected to a second brake cable (5b). Brake cable (5a) is connected to spring loaded lever (63a), and brake cable (5b) is connected to spring loaded lever (63b). Enclosed within each of first wheel (1a) and second wheel (1b) is a drum brake system as shown in FIGS. 7a and 7b. When describing the brake system, it should be understood that numerals followed by designations "a, b" is intended to refer to the first wheel (1a) and second wheel (1b), where "a" designates the first wheel (1a) and "b" designates the second wheel (1b). By way of example, brake shoe (64a, 64b) means a first brake shoe (64a) for first wheel (1a) and a second brake shoe (64b) for second wheel (1b); and brake shoe (65a, 65b) means a second brake shoe (65a) for first wheel (1a), and a second brake shoe (65b) for second wheel. FIGS. 7a and 7b show the details of the drum brake system utilized by first wheel (1a) and second wheel (1b). The drum brake system is made up of two brake shoes (64a, 64b) and (65a, 65b) on each side of the inside of first wheel (1a) and second wheel (1b). Brake shoe (64a, 64b) is connected to brake shoe (65a, 65b) by a set of springs (67a, 67b) and (68a, 68b), where springs 67a and 68a refer to the springs in first wheel (1a); and springs 67b and 68b refer to the springs in second wheel (1b). An elliptical-shaped cam (66a, 66b) as shown in FIGS. 7a and 7b is located between the two brake shoes (64a, 64b) and (65a, 65b), and a cylinder-shaped drum. The cylindrical-shaped drum extends around the brake shoes (64a, 64b) and (65a, 65b). In the FIGS. of 7a and 7b, the cylindrical-shaped drum is omitted for purposes of better illustrating the principles of the dead man brake mechanism with clarity. The cam (65a, 65b) is connected to the spring-loaded lever (63a, 63b). When the brake actuator (4) is in the deactivated state (i.e., the configuration of FIG. 7b where the actuator (3) along handle (3) is not squeezed by a user), the spring force applied to the lever (63a) for first wheel (1a) and the spring force applied to the lever (63b) for second wheel (1b) positions the corresponding cam (65a, 65b) for corresponding first wheel (1a) and second wheel (1b) such that the length of the respective cam (65a, 65b) creates separation between the two brake shoes 64a and 65a of first wheel (1a) and brake shoes 64b and 65b of second wheel (1b). The separation presses the brake shoes(64a, 64b) and (65a, 65b) against their respective cylinder drums, which in turn causes the drums to create sufficient friction against the inner surface of first wheel (1a) and inner surface of second wheel (1b) to prevent their respective rotations. FIG. 7b shows the resultant configuration of the cam (65a, 65b), brake shoes (64a, 64b) and (65a, 65b) and lever (63a, 63b) in the deactivate state in which the drum prevents rotation of the wheels (1a, 1b).

When the brake actuator (4) is activated by squeezing the actuator (4) toward the handle (3), tension is created in the brake cables (5a, 5b) which applies a force to the lever (65a) of first wheel (1a) and lever (65b) of second wheel (1b) and causes the lever (65a, 65b) to move into the position shown in FIG. 7a. As the lever (65a, 65b) moves from the deactivated state of FIG. 7b to that of FIG. 7a, cam (65a, 65b) rotates, causing the separation distance between the brake shoes (64a, 64b) and (65a, 65b) to decrease. The force of the springs (67a, 67b) and (68a, 68b) connecting the brake shoes (64a, 64b) and (65a, 65b) pulls the brake shoes (64a, 64b) and (65a, 65b) away from the respective drum, thereby reducing the friction against first wheel (1a) and second wheel (1b), and allowing them to rotate and the assembly (1') to move.

When the brake actuator (4) is deactivated by releasing the actuator (4) from the handle (3), the force of the spring (67a, 67b) and (68a, 68b), acts upon the lever (63a, 63b) such that the cam (65a, 65b) returns to the position of FIG. 7b (i.e., "deactivated state"), in which the braking system is re-applied, thereby preventing the first wheel (1a) and the second wheel (1b) from rotating.

It should be understood that variations and modifications to the dead man braking mechanism are contemplated. For example, while the preferred embodiment as shown in the Figures and described hereinbefore utilizes a dead man brake on the first and second wheels (1a and 1b, respectively), the dead man brake may readily be modified to be used on all of the wheels (first wheel (1a), second wheel (1b), third wheel (2a) and fourth wheel (2b)). Alternatively, the present invention may also include other brake designs. For example, the brake design may include caster locks on any or all of the wheels. Alternatively, disc brakes or bicycle brakes may be employed.

The assembly (1') can secure and transport cylinders, without a reduction in stability (e.g., no increased tendency for falling) and/or without a reduction in maneuverability (e.g., no increased safety risk associated with tilting the cylinder). Various sized cylinders can be secured to the assembly (1'). For example, a T size cylinder can be employed, having a diameter of about 9.25 inches and a height of about 51 inches. By way of another example, two or more T cylinders can be banded together to form a bundle. Still further, a customized cylinder with a height of up to 7 ft and a diameter of between 7 and 40 inches can be secured into the frame (1').

Generally speaking, prior to emergence of the present invention, cylinders with greater heights and weight (including the weight of the gas filled into the cylinder) have been more difficult to navigate, maneuver and tip for purposes of transporting over an elevated surface or other uneven surface. However, the structural attributes of the inventive assembly (1') allow for improved maneuverability and transport of relatively large cylinders (e.g., T sized cylinders) in a stable manner. The novel design reduces the tendency of tipping for even large and heavy T sized cylinders. Additionally, the assembly (1') has been engineered to maintain structural integrity of the valve (13) under repeated high impact drops or free falls of the assembly (1') to the ground.

Figure 8C:
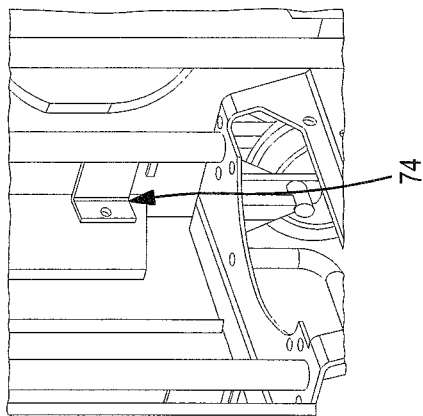
FIGS. 8a, 8b and 8c show a modular panel housing entirely enclosed around the assembly.
Figure 8B:
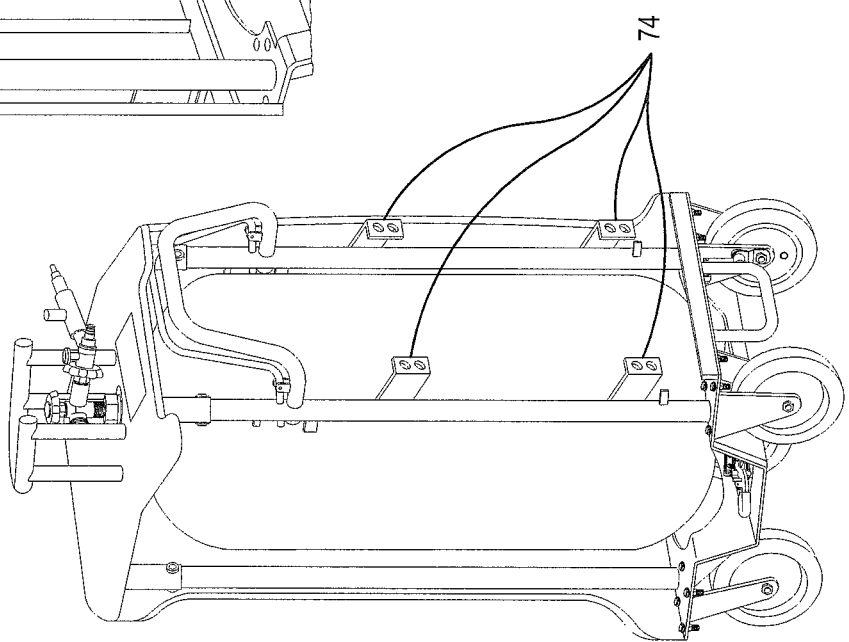
Figure 8A:
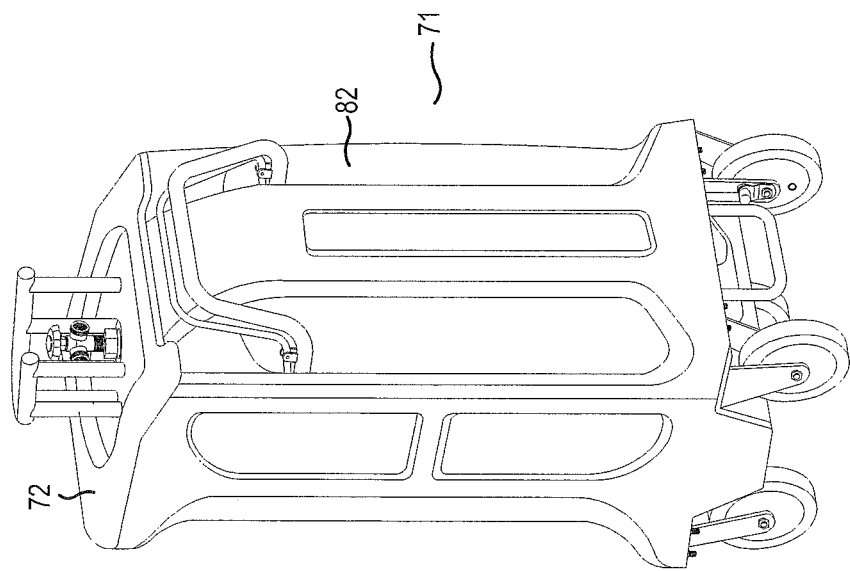
Figure 9:
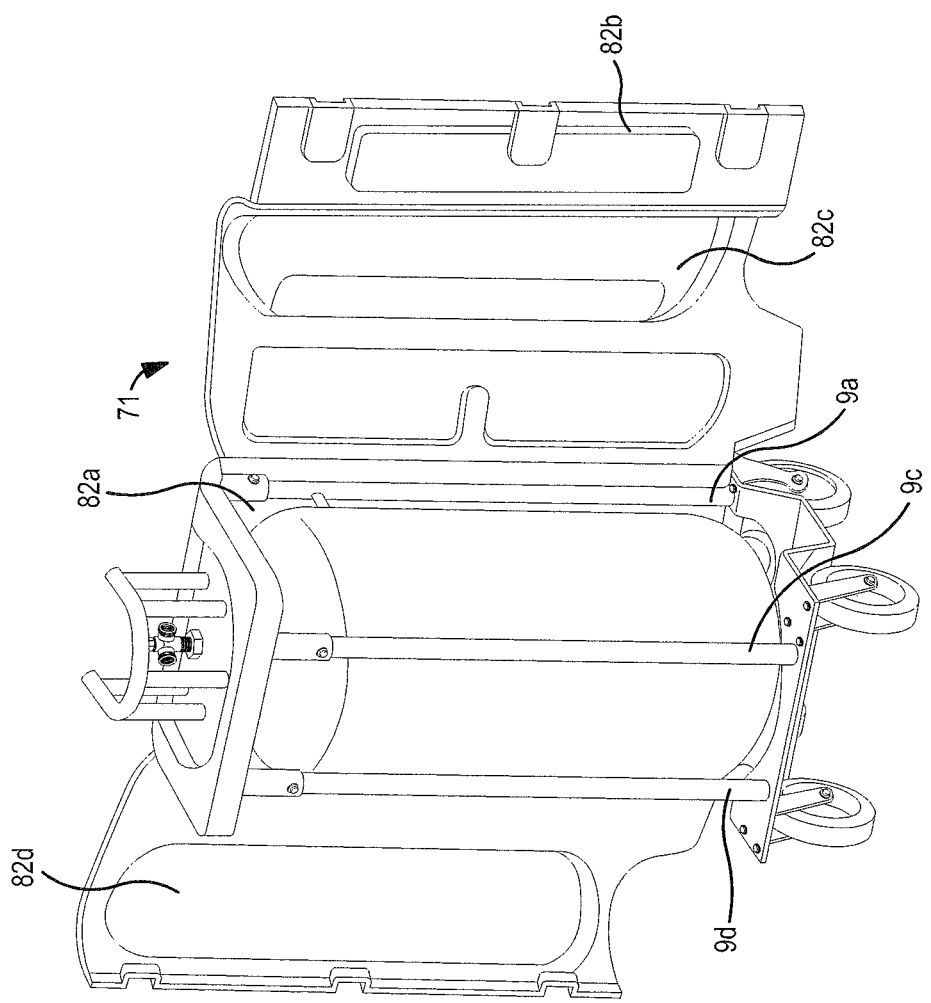
FIG. 9 shows the modular panel enclosure of FIG. 8a in the fully open configuration for visual inspection of the cylinder mounted and secured in the assembly.

The transportable support assembly (1') may include a modular housing. The modular housing can facilitate relatively quick assembly of on-board components and enable visual inspection of the cylinder (11). One example of such a modular housing is shown in FIGS. 8a-8c and FIGS. 9a-9b. FIGS. 8a-8c show a modular housing 71 designed to close and open for visually inspecting the cylinder (11) which is mounted and secured onto the transport support assembly (1'). The modular housing 71 includes a panel enclosure (82) which wraps around the multiple elongated rods (9a, 9b, 9c and 9d). FIG. 9 shows that only one section of the panel enclosure 82 is connected to the multiple elongated rods (9a, 9b, 9c and 9d). FIG. 9 shows the modular housing 71 opened. The modular housing 71 can be characterized as having four panel sections, namely, a first section 82a, a second section, 82b, a third section 82c and a fourth section 82d. A first section (82a) remains permanently closed and secured along a first side (35) which is bounded by elongated rods (9a) and (9b); a second section (82b) closes and opens along a second side (36) diametrically opposed to first side (35) where the second side (36) is bounded by elongated 9c and 9d; a third section (82c) closes and opens along a third side (69) of assembly (1') which is bounded by elongated rods (9a) and (9c); and a fourth section (82d) closes and opens along a fourth side (70) diametrically opposed to third side (69) and where the fourth side (70) is bounded by elongated rods (9b) and (9d). It should be understood that each of the panel sections (82a, 82b, 82c and 82d) can be varying sizes. FIG. 9 shows that a first section of the panel enclosure (82a) is only connected along the first side (35). Brackets (74) as shown in FIGS. 8b and 8c or other suitable elements may be welded at specific locations on elongated rods (9a) and (9b) to secure the panel enclosure (82) along the first side (35). Various structural elements can be fastened onto the panel enclosure (82a) to engage with brackets (74) of the elongated rods (9a) and (9b) along first side (35) of assembly (1'), including but not limited to nuts and bolts; jack nuts; and thread forming screws. The remaining sections (82b), (82c) and (82d) of the panel enclosure (82) can open and close as shown in FIG. 9 to allow visual inspection of the cylinder (11), which can be configured to rotate as previously described herein. Section 82b can latch and unlatch onto the corresponding section (82d) of panel enclosure (82) to allow opening and closing.

A hinge is preferably present between section (82d) and (82a) of plastic enclosure (82) and also between section (82a) and (82c) of plastic enclosure (82). A hinge may also be present between panel section (82b) and panel section (82d). Other designs are contemplated. For example, panel sections (82b) and (82d) may be secured together permanently using any suitable means, such as metal fasteners. Typical metal fasteners include threaded inserts and '82b configured in substantial alignment, thereby fully exposing a second side (36), a third side (69) and a fourth side (70) of assembly (1'). When the second section (82b), third section (82c) and fourth section (82d) of the panel enclosure (82) are opened, the cylinder(11) can be visually inspected and rotated by a user pulling latch (17) into the second open position (FIG. 4d), as described hereinbefore.

Figure 10A:
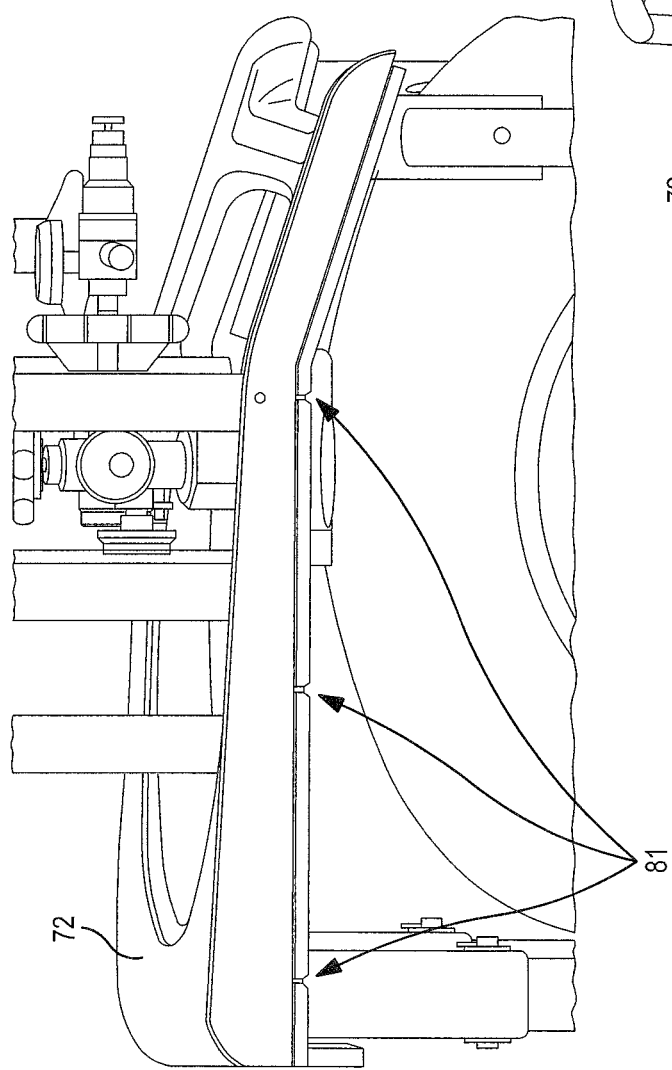
FIGS. 10a and 10b show a top housing enclosed over top plate.
Figure 10B:
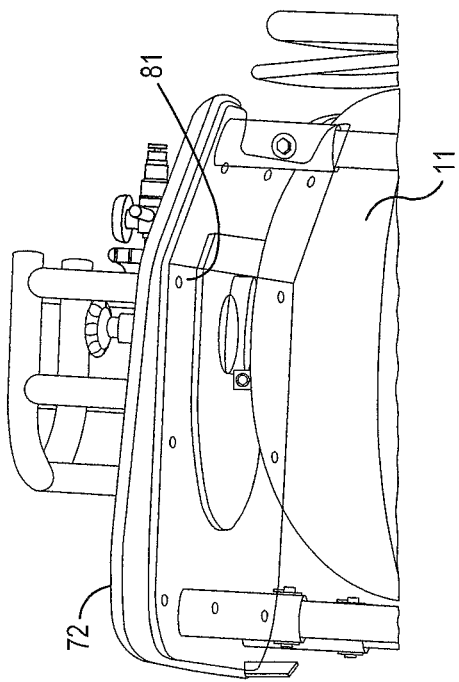

A top plastic housing 72 may also be secured to the top plate (7) by any suitable means, including, but not limited to, thread forming screws 81, as shown in FIGS. 10b and 10b.

It should be understood that the modular housing (71) is one example and other enclosures may be utilized for transport assembly (1'). For example, a so-called "boot" may be configured to receive a bottom section of the cylinder. Alternatively, a permanently enclosed housing may be employed if visual inspection of the cylinder (11) is not required. Other housing structures may only partially cover the assembly or be made out of other materials such as metal.

Various means for fabricating the frame of the transport assembly (1') are contemplated. One example involves cutting and bending the first plate (7) and second plate (14) to the requisite shape and dimensions. The elongated rods (9a), (9b), (9c) and (9d) are cut to the required lengths and then each elongated rod (9a), (9b), (9c) and (9d) is welded to the second plate (14) at a specific location of second pate (14) along its periphery (58). The protective ring (8) can be fabricated as a separate component whereby solid rods are cut and bent to a specific radius of curvature to achieve the u-shaped bend geometry. Next, five vertical rods are welded at specific locations along the u-shape bend to create the required spacing therebetween. The resultant u-shape protective ring (8) can then be welded to the first plate (7). Vertical posts are preferably welded to each of the four corners below the first plate (7). This first plate-protective ring sub-assembly is then positioned over the elongated rods (9a), (9b), (9c) and (9d) and then fastened with cotter pins. It should be understood that other means for fabricating the assembly (1') as would be recognized by one of ordinary skill in the art are contemplated. For example, any suitable means for connecting the sub-assembly to the elongated rods (9a), (9b), (9c) and (9d) can be utilized without departing from the scope of the invention.

Any suitable material may be used to form modular housing (71). In one example, the panel sections 82a-82d are a single blow molded plastic material, such as high density polyethylene; and the top housing is a suitable plastic material. In another example, the panel sections are molded as separate components which are then attached to each other by any suitable means.

The inventors have performed several experiments to assess the structural integrity of the assembly (1') with cylinder (11) mounted and secured thereto, as will now be discussed in the Examples below.

Example 1—Drop Test 1; First Point of Impact

A first drop test was conducted according to standard ISO11117:1998(E) to evaluate the structural integrity of the assembly (1') and its ability to protect the integrity of a cylinder valve (13) when secured on the assembly (1'). Substantially steel-based components were fabricated by the inventors to create the transport support assembly (1') as shown in FIG. 1. A composite cylinder (height of 46.5 inches and diameter of 20 inches) was mounted and secured onto the second plate (14). Specifically, along the bottom of the assembly (1'), the neck portion at the second end of the cylinder (11) had a recessed region (47) which was mated and fitted within a complimentary protruded section (48) within the opening of second clamp (28). The first end of cylinder (11) at the top of the assembly (1') was mounted so that it extended through the inner opening of the first clamp (15), which was located below a first plate (7). The first clamp (15) was not connected to the first plate (7). A Delrin® washer (42) extended through the first clamp (7) and onto the first plate (7), as shown in FIGS. 2c and 3b, contacted the outer surface of the first neck of cylinder (11) and thereby provided the necessary support and maintenance of the cylinder (11) along the first end in a substantially upright position.

To accurately simulate the weight of gas typically contained in cylinder (11) when transported and maneuvered on assembly (1'), weight in the form of coffee beans was added to the cylinder (11). Additional weight was added into the cylinder (11) to take into account the weight of the modular housing (71), which was not secured onto the assembly (1') for the drop testing. The absence of the modular housing (71) was intended to allow observation and visual inspection of the frame and cylinder components upon point of impact.

The assembly (1') with cylinder (11) was elevated in an inverted orientation so that the top protective ring (8) was closest to the ground. The assembly (1) with cylinder (11) was raised until the top protective ring (8) was 6 feet from the ground (i.e., impact surface). A fixture was built to properly hold the cylinder (11) with the longitudinal axis of the cylinder (11) at an angle of 30° to the vertical. The first drop test was conducted so that a first point on protective ring (8) was subject to impact upon hitting the ground. To ensure the first point of ring (8) is subject to impact, the fixture was configured so that the first point of ring (8) represented the closest point of ring (8) to the ground. In this manner, a worse-case scenario was simulated where the stress of the impact is concentrated.

Suspended in this starting position, the fixture released the assembly (1') with cylinder (11), causing it to drop onto an unyielding surface at the first point of the protective ring (8). The valve (13) did not incur visible damage that would be expected to cause leakage of gas from the valve (13) itself. Additionally, the connection between the valve (13) and the cylinder (11) remained capable of opening and closing. The valve (13) was defined as operable and the first drop test was deemed successful in accordance with ISO 11117:1998(E).

Example 2—Drop Test 2; $2^{nd}$ Point of Impact

Utilizing the same apparatus (1') and cylinder (11) of Example 1, a second drop test was conducted in a manner identical to Example 1. The second drop test was conducted so that a second point of protective ring (8) spaced apart 60° from the first point of ring (80) was subject to impact when hitting the ground. To ensure the second point of ring (8) was subject to impact, the fixture rotated assembly (1') on its axis 60° relative to that of Example 1 so that the second point of ring (8) represented the closest point of ring (8) to the ground.

The valve (13) did not incur visible damage that would be expected to cause leakage of gas from the valve (13) itself. Additionally, the connection between the valve (13) and the cylinder (11) remained capable of opening and closing. The valve (13) was defined as operable and the second drop test was deemed successful in accordance ISO 11117:1998(E).

Example 3—Drop Test 3; 3rd Point of Impact

Utilizing the same apparatus (1') and cylinder (11) of Example 1, a third drop test was conducted in a manner identical to Examples 1 and 2. The third drop test was conducted so that a third point of protective ring (8) spaced apart 60° from the second point of protective ring (80) was subject to impact when hitting the ground. To ensure the third point of ring (8) was subject to impact, the fixture rotated assembly (1') on its axis 60° relative to that of Example 2, so that the third point of ring (8) represented the closest point of protective ring (8) to the ground.

The valve (13) did not incur visible damage that would be expected to cause leakage of gas from the valve (13) itself. Additionally, the connection between the valve (13) and the cylinder (11) remained capable of opening and closing. The valve (13) was defined as operable and the third drop test was deemed successful in accordance ISO 11117:1998(E).

Having tested 3 points on protective ring (8) which span 180°, the entire perimeter of the u-shaped bend was determined to meet the requirements in accordance with ISO 11117:1998(E).

Example 4—Drop Test 4

Utilizing the same apparatus (1') and cylinder (11) of Example 1, a fourth drop test was conducted in a manner identical to Examples 1, 2 and 3. The fourth drop test was conducted so that a fourth point of protective ring (8) spaced apart 60° from the third point of protective ring (80) was subject to impact when hitting the ground. To ensure the fourth point of ring (8) was subject to impact, the fixture rotated assembly (1') on its axis 60° relative to that of Example 3, so that the fourth point of ring (8) represented the closest point of protective ring (8) to the ground. The valve (13) did not incur visible damage that would be expected to cause leakage of gas from the valve (13) itself. Additionally, the connection between the valve (13) and the cylinder (11) remained capable of opening and closing. The valve (13) was defined as operable and the fourth drop test was deemed successful in accordance with ISO 11117:1998 (E).

Example 5—Drop Test 5

Utilizing the same apparatus (1') and cylinder (11) of Example 1, a fifth drop test was conducted in a manner identical to Examples 1, 2, 3 and 4. The fifth drop test was conducted so that a fifth point of protective ring (8) spaced apart 60° from the fourth point of protective ring (80) was subject to impact when hitting the ground. To ensure the fifth point of ring (8) was subject to impact, the fixture rotated assembly (1') on its axis 60° relative to that of Example 4, so that the fifth point of ring (8) represented the closest point of protective ring (8) to the ground. The valve (13) did not incur visible damage that would be expected to cause leakage of gas from the valve (13) itself. Additionally, the connection between the valve (13) and the cylinder (11) remained capable of opening and closing. The valve (13) was defined as operable and the fifth drop test was deemed successful in accordance to ISO 11117:1998(E).

Example 6—Drop Test 6

Utilizing the same apparatus (1') and cylinder (11) of Example 1, a sixth drop test was conducted in a manner identical to Examples 1, 2, 3, 4 and 5. The sixth drop test was conducted so that a sixth point of protective ring (8) spaced apart 60° from the fifth point of protective ring (80) was subject to impact when hitting the ground. To ensure the sixth point of ring (8) was subject to impact, the fixture rotated assembly (1') on its axis 60° relative to that of Example 5, so that the sixth point of ring (8) represented the closest point of protective ring (8) to the ground. The valve (13) did not incur visible damage that would be expected to cause leakage of gas from the valve (13) itself. Additionally, the connection between the valve (13) and the cylinder (11) remained capable of opening and closing. The valve (13) was defined as operable and the sixth drop test was deemed successful in accordance to ISO 11117:1998(E).

The present invention, as has been described herein, offers numerous benefits over conventional carts. For example, the ability of the present invention (i) to maintain structural integrity of the valve (13) in a worst-case scenario; (ii) securely lock cylinder (11) with a quick-release, user-friendly latch mechanism; (iii) allow the cylinder (11) to rotate while remaining substantially upright; (iv) prevent inadvertent rolling or movement with a dead man brake mechanism; (v) allow selective tipping and rotated wheels for improved maneuverability and stability during transport are improvements not realized or possible by conventional mobile apparatuses. Moreover, the benefits of the present invention become even more significant with larger capacity cylinders or containers mounted on assembly (1'). For example, the ability to use heavier and larger T-sized cylinders on carts that offered all of the benefits of the present invention was not possible prior to emergence of the present invention; such larger sized cylinders reduce the frequency of loading and unloading of cylinders on carts. Additionally, unlike prior carts, the present invention allows an empty cylinder to remain mounted on assembly (1') and be filled in a safe, fast and reliable manner. A cylinder weighing greater than 150 kg may likely pose significant risk if utilized on a conventional cart and be generally ineffective for transport and maneuver over uneven surfaces.

While it has been shown and described what is considered to be certain embodiments of the invention, it will, of course, be understood that various modifications and changes in form or detail can readily be made without departing from the spirit and scope of the invention. For example, the clamping mechanism may be utilized along the first end instead of the second end. Still further, where rotation of cylinder is not required, a clamping mechanism can be employed on one end with the other end fixedly secured. The frame structure can be modified without departing from the present invention, such that elongated rods are removed and a container or cylinder is clamped at the top end of the frame structure and either fixedly secured onto a bottom plate or freely hanging at the bottom end.

Still further, the assembly (1') can be equipped with sensors to measure the amount of content stored inside the cylinder (11). For example, if the cylinder (11) stores a compressed gas, the pressure of the compressed gas stored inside the cylinder (11) can be measured to determine the amount of gas content. The assembly (1') can also be equipped with other sensors to manage, monitor, measure and/or store various attributes, including, but not limited to, operational data, such as temperature of the stored gas in the cylinder (11), and flow rate of the gas withdrawn from the cylinder (11) during usage. The sensors are preferably configured to transmit the measured operational data wirelessly to a remote data storage unit. The measured operational data from the remote data storage unit can be retrieved in any manner, such as, for example, at regular intervals or real-time to manage, monitor, measure and/or store the operational data. The data can be inputted into a control system to configure alarms to allow corrective action to be manually or automatically implemented when one or more selected attributes have been determined to reach a predefined set-point. For example, a user may decide to replace a depleted assembly (1') with a replenished assembly (1') having a cylinder (11) with more gas content when the pressure of gas inside the cylinder (11) of the depleted assembly (1') drops below a certain limit. In another example the user may decide to isolate the cylinder (11) from a flow manifold when the flow rate is more than a desired set point.

The operational data from a single assembly (1') or in combination with several other assemblies (1') deployed at the same physical location or at different physical locations can also be used to generate predictive analytics around the usage of the content from the cylinder (11) and forecast future usage rates.

Still further, other suitable designs for the protective ring (8) are contemplated by the present invention. For example, instead of employing five vertical bars as shown in the Figures, the protective ring (8) may include more or less than five vertical bars. In one embodiment, the protective ring (8) can include three or four vertical bars extending between the first plate (7) and the u-shape bend structure, with one or more of the vertical bars located at positions along the u-shape bend structure that are different than shown in the Figures. The size and shape of the u-shape bend may be modified as well. For example, a u-shaped or c-shaped bend may be configured to have a larger radius of curvature. Additionally, the protective ring (8) may attach to a first plate (7) without reinforcement sheet attached (e.g., welded) underneath the first plate (7).

It is, therefore, intended that this invention not be limited to the exact form and detail herein shown and described, nor to anything less than the whole of the invention herein disclosed and hereinafter claimed.

The invention claimed is:

1. A transportable support assembly (1') configured to securely hold a container (11) therewithin, said transportable support assembly (1'), comprising:
    a first clamp (15) spaced apart from a first plate (7);
    a second plate (14) located a predetermined distance away from the first clamp (15);
    multiple elongated rods (9a, 9b, 9c and 9d) extending between the first plate (7) and the second plate (14) and defining a first side (35) of the transportable support assembly (1') and a second side (36) of the transportable support assembly (1'), said second side (36) substantially diametrically opposed to the first side (35);
    the first plate (7), the second plate (14) and the multiple elongated rods (9a, 9b, 9c and 9d) being arranged to create a protective opening (29), said protective opening (29) adapted to receive the container (11) that can be secured to a second clamp (28) located on the second plate (14); and
    a protective ring (8) operably connected to the first plate (7), said protective ring (8) characterized by an opening facing the first side of the transportable support assembly (1');
    a handle (3) located at a predetermined handle height along the first side (35), said handle operably connected to one or more of the multiple elongated rods (9a, 9b, 9c and 9d);
    a first wheel (1a) and a second wheel (1b) spaced apart from the first wheel (1a) by a first predetermined distance, each of said first wheel (1a) and said second wheel (1b) operably connected to the second plate (14) along the first side (35), each of said first wheel (1a) and said second wheel (1b) being non-rotatable along a vertical axis;
    a third wheel (2a) operably connected to the second plate (14) along the second side (36), said third wheel (2a) being rotatable;
    a dead man brake actuator (4) extending along at least a portion of the handle (3), said dead man brake actuator (4) in mechanical communication with the first wheel (1a) and the second wheel (1b), said dead man brake actuator (4) movable between an activated state and a deactivated state, wherein the dead man brake actuator (4) in the deactivated state is configured to prevent movement of the transportable support assembly (1') and wherein the dead man brake actuator (4) in the activated state is configured to allow movement of the transportable support assembly (1').

2. The transportable support assembly (1') of claim 1, further comprising a modular housing (71) extending around the transportable support assembly (1').

3. The transportable support assembly (1') of claim 1, further comprising a foot ledge (12) secured to the second plate (14) along the first side (35).

4. The transportable support assembly (1') of claim 1, wherein the multiple elongated rods comprise a first elongated rod (9a) and a second elongated rod (9b) spaced apart from the first elongated rod (9a) to define, at least in part, the first side (35).

5. The transportable support assembly (1') of claim 1, wherein the multiple elongated rods comprises a third elongated rod (9c) and a fourth elongated rod (9d) spaced apart from the third elongated rod (9c) to define, at least in part, the second side (36).

6. A protective support structure (22), comprising:
    a first plate (7);
    a protective ring (8) along the first plate (7);
    a clamping mechanism comprising a second clamp (28) operably connected to a second plate (14) located a predetermined distance away from the first plate (7);
    multiple elongated rods (9a, 9b, 9c and 9d) extending between the first plate (7) and the second plate (14), each of said multiple elongated rods (9a, 9b, 9c and 9d) having a first end and a second end, each of said first ends operably connected to a corresponding first region along the periphery of the first plate (7), and each of said second ends operably connected to a corresponding second region along the periphery of the second plate (14);
    wherein the first plate (7), the second plate (14) and multiple elongated rods (9a, 9b, 9c and 9d) are configured to define a first side (35) of the protective support structure (22) and a second side (36) of the protective support structure (22); a handle between elongated rods along the first side, said protective ring (8) characterized by an opening facing the handle (3).

7. The protective support structure (22) of claim 6, said handle (3) comprising a horizontal portion extending between the multiple elongated rods (9a, 9b, 9c and 9d) and a first vertical portion extending down from a first end of the horizontal portion and a second vertical portion extending down from a second end of the horizontal portion, said first vertical portion and said second vertical portion operably connected to one or more of the multiple elongated rods (9a, 9b, 9c and 9d) at a predetermined handle height along the first side (35).

8. The protective support structure (22) of claim 6, further comprising a foot ledge (12) secured to the second plate (14) along the first side (35).

9. The protective support structure (22) of claim 6, further comprising a first wheel (1a) and a second wheel (1b) spaced apart from the first wheel (1a), said first wheel (1a) and said second wheel (1b) operably connected to the second plate (14) along the first side (35), each of said first wheel (1a) and said second wheel (1b) being non-rotatable along a vertical axis.

10. The protective support structure (22) of claim 9, further comprising a third wheel (2a) operably connected to the second plate (14) along the second side (36), said third wheel (2a) being rotatable.

11. A transportable support assembly (1') configured to securely hold a container (11) therewithin, said transportable support assembly (1'), comprising:
    a first plate (7);
    a second plate (14) located a predetermined distance away from the first plate (7);
    multiple elongated rods (9a, 9b, 9c and 9d) extending between the first plate (7) and the second plate (14) and defining a first side (35) of the transportable support assembly (1') and a second side (36) of the transportable support assembly (1');

the first plate (7), the second plate (14) and multiple elongated rods (9a, 9b, 9c and 9d) are arranged to create a cage-like enclosure (29), said cage-like enclosure (29) adapted to receive the container (11) that can be secured to a second clamp (28) located on the second plate (14); and a protective ring (8) on the first plate (7), said protective ring (8) characterized by an opening facing the first side (35) of the transportable support assembly (1');

a handle (3) located at a predetermined handle height along the first side (35), said handle operably connected to one or more of the multiple elongated rods (9a, 9b, 9c and 9d);

a first wheel (1a) and a second wheel (1b) spaced apart from the first wheel (1a), each of said first wheel (1a) and said second wheel (1b) operably connected to the second plate (14) along the first side (35); each of said first wheel (1a) and said second wheel (1b) being non-rotatable along a vertical axis;

a third wheel (2a) and fourth wheel (2b) operably connected to the second plate (14) along the second side (36), said third wheel (2a) and fourth wheel (2b) being rotatable; and a braking mechanism in mechanical communication with at least the first wheel (1a) and the second wheel (1b).

12. A transportable support assembly (1') with container comprising:

a cage-like enclosure (29) comprising multiple elongated rods (9a, 9b, 9c and 9d), said cage-like enclosure (29) configured to receive the container (11), the container (11) holding a gas in a pressurized state;

the cage-like enclosure (29) having a protective ring (8) permanently and operably fixed atop a first end of the cage-like enclosure (29), said protective ring (8) partially encapsulates a valve (13) protruding from a top plate (7) of the cage-like enclosure (29), and is configured to protect the valve (13).

multiple wheels operably connected to a second end of the mobile, cage-like enclosure (29).

13. The transportable support assembly (1') with container (11) of claim 12, wherein the amount of gas in the container is in an amount equivalent to the gas held in a T-sized six pack bundle.

14. The transportable support assembly (1') with container (11) of claim 12, said cage-like enclosure configured to load, maneuver and securely hold a neck of a container (11).

15. The transportable support assembly (1') with container (11) of claim 12, further comprising a handle (3), said handle (3) comprising a horizontal portion extending between the multiple elongated rods (9a, 9b, 9c and 9d) and a first vertical portion extending down from a first end of the horizontal portion and a second vertical portion extending down from a second end of the horizontal portion, said first vertical portion and said second vertical portion operably connected to one or more of the multiple elongated rods (9a, 9b, 9c and 9d) at a predetermined handle height along a first side (35).

16. The transportable support assembly (1') with container (11) of claim 12, said protective ring (8) characterized by an opening facing a handle (3) of the transportable support assembly (1').

* * * * *